United States Patent
Chang et al.

(10) Patent No.: US 10,972,090 B1
(45) Date of Patent: Apr. 6, 2021

(54) OUTPUT STAGE CIRCUIT FOR TRANSMITTING DATA VIA BUS

(71) Applicant: Richtek Technology Corporation, Zhubei (TW)

(72) Inventors: Yu-Wen Chang, Nantou (TW); Leng-Nien Hsiu, Hsinchu (TW); Isaac Y. Chen, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 16/984,016

(22) Filed: Aug. 3, 2020

(30) Foreign Application Priority Data

Oct. 16, 2019 (TW) ................... 108137277

(51) Int. Cl.
H03K 17/16 (2006.01)
H03K 17/30 (2006.01)
H01L 27/02 (2006.01)

(52) U.S. Cl.
CPC ....... H03K 17/161 (2013.01); H01L 27/0255 (2013.01); H01L 27/0259 (2013.01); H01L 27/0266 (2013.01); H01L 27/0285 (2013.01); H03K 2217/0063 (2013.01); H03K 2217/0072 (2013.01)

(58) Field of Classification Search
CPC ............ H01L 27/0255; H01L 27/0285; H01L 27/0266; H01L 27/0259; H03K 2217/0072; H03K 2217/0063

USPC ......................................... 327/382
See application file for complete search history.

(56) References Cited

U.S. PATENT DOCUMENTS

| 2010/0277217 | A1* | 11/2010 | Takarada | ....... | H03K 19/018592 |
| | | | | | 327/419 |
| 2011/0182369 | A1* | 7/2011 | Takarada | ............ | H04L 25/0272 |
| | | | | | 375/257 |
| 2019/0229726 | A1 | 7/2019 | Lecce et al. | | |

* cited by examiner

Primary Examiner — Metasebia T Retebo
(74) Attorney, Agent, or Firm — Tung & Associates

(57) ABSTRACT

An output stage circuit for transmitting data via a bus includes a high side switch, a high side diode structure, a high side clamp circuit, a low side switch, and a low side diode structure. An impedance circuit of the bus is coupled between the high side switch and the low side switch, for generating a differential output signal according to high and low side output signals. A high side N-type region of the high side diode structure encompasses a high side P-type region thereof, and a low side N-type region of the low side diode structure encompasses a low side P-type region thereof. The high side clamp circuit is connected to the high side N-type region in series, for clamping a voltage of the high side N-type region to be not lower than a predetermined voltage, to prevent a parasitic PNP bipolar junction transistor from being turned ON.

16 Claims, 18 Drawing Sheets ated priority to TW 108137277

OUTPUT STAGE CIRCUIT FOR TRANSMITTING DATA VIA BUS

CROSS REFERENCE

The present invention claims priority to TW 108137277 filed on Oct. 16, 2019.

BACKGROUND OF THE INVENTION

Field of Invention

The present invention relates to an output stage circuit configured to operably transmit data via a bus; particularly, it relates to such output stage circuit capable of withstanding positive and negative voltages.

Description of Related Art

Please refer to FIG. 1A, which shows a schematic diagram of a conventional controller area network (CAN) 1. The CAN 1 comprises plural data transceiver controller circuits 11 and a bus 12. Each data transceiver controller circuit 11 includes a controller 111 and a transceiver circuit 113. The controller 111 can control the transceiver circuit 113 to transmit or receive data via the bus 12. The bus 12 has a high side signal line, a low side signal line and an impedance circuit coupled between the high side signal line and the low side signal line. As shown in FIG. 1A, the impedance circuit can include, for example but not limited to, two resistors RL. Each resistor RL has its two ends electrically connected to the high side signal line and the low side signal line, respectively. The high side signal line has plural high side output terminals CANH, which are respectively coupled to the corresponding data transceiver controller circuits 11. The low side signal line has plural low side output terminals CANL, which are respectively coupled to the corresponding data transceiver controller circuits 11. On one hand, each data transceiver controller circuit 11 can generate a differential output signal between the corresponding high side output terminal CANH and the corresponding low side output terminal CANL, so as to transmit data. On the other hand, each data transceiver controller circuit 11 can receive a differential input signal via the corresponding high side output terminal CANH and the corresponding low side output terminal CANL, so as to receive data.

Please refer to FIG. 1B, which shows a schematic diagram of a conventional data transceiver controller circuit 11. In the data transceiver controller circuit 11, the transceiver circuit 113 includes a driver circuit 1131, a receiver 1132 and an output stage circuit 1133. Different data transceiver controller circuits 11 can transmit or receive data via the bus 12 during different periods. While one of the data transceiver controller circuits 11 is transmitting or receiving data, the rest of the data transceiver controller circuits 11 connected to the bus 12 do not transmit or receive data via the bus 12, but these data transceiver controller circuits 11 are required to withstand a voltage difference between the high side signal line and the low side signal line by their output stage circuits 1133. For safety, the specification requires the output stage circuit 1133 to be able to withstand a voltage difference which is for example between +48V and −48V.

As shown in FIG. 1B, the controller 111 can control the driver circuit 1131 of the transceiver circuit 113, to operate a high side switch QH1 and a low side switch QL1 of the output stage circuit 1133, thus transmitting data via a corresponding high side output terminal CANH and a corresponding low side output terminal CANL. On the other hand, through the receiver 1132, the data transceiver controller circuit 11 can receive differential input signals via the corresponding high side output terminal CANH and the corresponding low side output terminal CANL, so as to receive data. The high side switch QH1 is electrically connected to an internal voltage VDD, whereas, the low side switch QL1 is electrically connected to a reference voltage VSS.

Please still refer to FIG. 1B. During a period wherein the data transceiver controller circuits 11 does not transmit or receive data via the bus 12, a maximum voltage difference between +48V and −48V may exist across the output terminal CANH and the low side output terminal CANL. Therefore, it is necessary for the high side switch QH1 to be connected in series to a diode DH1 having a sufficient withstand voltage and for the low side switch QL1 to be connected in series to a diode DL1 having a having a sufficient withstand voltage to withstand the voltage difference between +48V and −48V. Under a situation where the high side switch QH1, the low side switch QL1, the diode DH1 and the diode DL1 are manufactured via a standard CMOS manufacturing process, when the high side switch QH1 or the low side switch QL1 is operating, a relatively greater current will flow through the diode DH1 or the diode DL1, thus causing a parasitic bipolar junction transistor (BJT) to be turned ON. Consequently and undesirably, operation error of the high side switch QH1 or the low side switch QL1 will occur, resulting in data transmission error. In light of above, it is required for the conventional output stage circuit 1133 to be manufactured by a non-standard CMOS manufacturing process. For example, the conventional output stage circuit 1133 needs to be manufactured by a silicon on insulator (SOI) manufacturing process, to avoid forming the parasitic BJT.

Please refer to FIG. 1C, which shows a schematic diagram of the structure of the diode DH1/DL1 for use in the conventional data transceiver controller circuit 11. As shown in FIG. 1C, the diode DH1/DL1 is not manufactured by a standard CMOS manufacturing process but instead by a SOI manufacturing process. The diode DH1/DL1 is formed on a semiconductor substrate, and includes an insulating layer, a P-type region and an N-type region. Although the SOI manufacturing process can avoid forming the parasitic BJT, the SOI manufacturing process is costly, as compared to the standard CMOS manufacturing process.

In view of the above, to overcome the drawbacks in the prior art, the present invention proposes an output stage circuit configured to operably transmit data via a bus, wherein a parasitic BJT is prevented from being turned ON and the manufacturing cost is reduced.

SUMMARY OF THE INVENTION

From one perspective, the present invention provides an output stage circuit configured to operably transmit data via a bus, the output stage circuit being formed on a P-type semiconductor substrate, wherein the output stage circuit is configured to operably generate a differential output signal between a high side output terminal and a low side output terminal which are connected to the bus; the output stage circuit comprising: a high side switch, which is configured to operate according to a high side operation signal, to generate a high side output signal, wherein the high side switch is electrically connected to an internal voltage; a high side diode structure connected in series to the high side switch, the high side diode structure being configured to operably transmit the high side output signal and to block a reverse bias voltage, wherein the high side diode structure includes: a high side P-type region, which is electrically connected to the high side switch, the high side P-type region being configured to operably receive the high side output signal; and a high side N-type region, which is coupled to the high side output terminal, the high side N-type region being configured to operably transmit the high side output signal, wherein beneath a top surface of the P-type semiconductor substrate, the high side N-type region encompasses a lateral side and a bottom side of the high side P-type region, to form a high side PN junction, wherein a high side substrate PN junction is formed between the high side N-type region and the P-type semiconductor substrate; a high side clamp circuit, which is connected in series to the high side N-type region, the high side clamp circuit being configured to operably clamp a voltage of the high side N-type region, to ensure the voltage of the high side N-type region not to be lower than a high side predetermined voltage, thereby preventing a parasitic PNP bipolar junction transistor formed between the high side diode structure and the P-type semiconductor substrate from being turned ON; a low side switch, which is configured to operate according to a low side operation signal, to generate a low side output signal, wherein the low side switch is electrically connected to a reference voltage; and a low side diode structure connected in series to the low side switch, the low side diode structure being configured to operably transmit the low side output signal and to block a reverse bias voltage, wherein the low side diode structure includes: a low side P-type region, which is electrically connected to the low side switch, the low side P-type region being configured to operably receive the low side output signal; and a low side N-type region, which is coupled to the low side output terminal, the low side N-type region being configured to operably transmit the low side output signal, wherein beneath the top surface of the P-type semiconductor substrate, the low side N-type region encompasses a lateral side and a bottom side of the low side P-type region, to form a low side PN junction, wherein a low side substrate PN junction is formed between the low side N-type region and the P-type semiconductor substrate; wherein the high side output terminal and the low side output terminal are configured to be coupled to an impedance circuit of the bus, the impedance circuit being coupled between the high side output terminal and the low side output terminal and being configured to operably generate a differential output signal according to the high side output signal and the low side output signal; wherein the high side N-type region directly contacts the P-type semiconductor substrate and there is no insulating layer between the high side N-type region and the P-type semiconductor substrate; wherein the low side N-type region directly contacts the P-type semiconductor substrate and there is no insulating layer between the low side N-type region and the P-type semiconductor substrate.

In one embodiment, the high side diode structure includes: a high side PNP bipolar junction transistor (BJT) having a base and a collector which are electrically connected to each other; wherein the high side P-type region includes an emitter of the high side PNP BJT, whereas, the high side N-type region includes the base of the high side PNP BJT.

In one embodiment, the high side PNP BJT has a concentric zone structure, wherein the emitter, the base and the collector of the high side PNP BJT are arranged from inside out successively, wherein the high side PNP BJT further includes an isolation region having N-type conductivity, the isolation region being electrically connected to and encompassing the collector of the high side PNP BJT, wherein the isolation region directly contacts the P-type semiconductor substrate, to form the high side PN junction.

In one embodiment, the low side diode structure includes: a low side PNP BJT having a base and a collector which are electrically connected to each other; wherein the low side P-type region includes an emitter of the low side PNP BJT, whereas, the low side N-type region includes the base of the low side PNP BJT.

In one embodiment, the low side PNP BJT has a concentric zone structure, wherein the emitter, the base and the collector of the low side PNP BJT are arranged from inside out successively, wherein the low side PNP BJT further includes an isolation region having N-type conductivity, the isolation region being electrically connected to and encompassing the collector of the low side PNP BJT, wherein the isolation region directly contacts the P-type semiconductor substrate, to form the low side PN junction.

In one embodiment, the high side clamp circuit includes a P-type MOS field effect transistor (FET) having a source coupled to the high side N-type region, wherein a gate of the P-type MOSFET is biased to a predetermined control voltage, to prevent the voltage of the high side N-type region from being lower than the high side predetermined voltage, wherein a drain of the P-type MOSFET is electrically connected to the high side output terminal.

In one embodiment, the high side clamp circuit further includes: a Zener diode coupled between the gate and the source of the P-type MOSFET, the Zener diode being configured to operably ensure that the P-type MOSFET is turned ON; a resistor connected in series to the Zener diode, the resistor being configured to operably limit a current flowing through the Zener diode; and a capacitor coupled between the gate of the P-type MOSFET and a ground voltage level, the capacitor being configured to operably reduce a coupling effect caused by a gate-drain parasitic capacitor of the P-type MOSFET.

In one embodiment, the high side clamp circuit includes a clamp PNP BJT having an emitter coupled to the high side N-type region, wherein a base of the clamp PNP BJT is biased to a predetermined control voltage, to prevent the voltage of the high side N-type region from being lower than the high side predetermined voltage, wherein a collector of the clamp PNP BJT is electrically connected to the high side output terminal.

From another perspective, the present invention provides an output stage circuit configured to operably transmit data via a bus, the output stage circuit being formed on an N-type semiconductor substrate, wherein the output stage circuit is configured to operably generate a differential output signal between a high side output terminal and a low side output terminal which are connected to the bus; the output stage circuit comprising: a high side switch, which is configured to operate according to a high side operation signal, to generate a high side output signal, wherein the high side switch is electrically connected to an internal voltage; a high side diode structure connected in series to the high side switch, the high side diode structure being configured to operably transmit the high side output signal and to block a reverse bias voltage, wherein the high side diode structure includes: a high side P-type region, which is electrically connected to the high side switch, the high side P-type region being configured to operably receive the high side output signal; and a high side N-type region, which is coupled to the high side output terminal, the high side N-type region being configured to operably transmit the high side output signal, wherein beneath a top surface of the N-type semiconductor substrate, the high side P-type region encompasses a lateral side and a bottom side of the high side N-type region, to form a high side PN junction, wherein a high side substrate PN junction is formed between the high side P-type region and the N-type semiconductor substrate; a low side switch, which is configured to operate according to a low side operation signal, to generate a low side output signal, wherein the low side switch is electrically connected to a reference voltage; a low side diode structure connected in series to the low side switch, the low side diode structure being configured to operably transmit the low side output signal and to block a reverse bias voltage, wherein the low side diode structure includes: a low side N-type region, which is electrically connected to the low side switch, the low side N-type region being configured to operably receive the low side output signal; and a low side P-type region, which is coupled to the low side output terminal, the low side P-type region being configured to operably transmit the low side output signal, wherein beneath the top surface of the N-type semiconductor substrate, the low side P-type region encompasses a lateral side and a bottom side of the low side N-type region, to form a low side PN junction, wherein a low side substrate PN junction is formed between the low side P-type region and the N-type semiconductor substrate; and a low side clamp circuit, which is connected in series to the low side P-type region, the low side clamp circuit being configured to operably clamp a voltage of the high side N-type region, to ensure the voltage of the low side P-type region not to be higher than a low side predetermined voltage, thereby preventing a parasitic NPN bipolar junction transistor formed between the high side diode structure and the P-type semiconductor substrate from being turned ON; wherein the high side output terminal and the low side output terminal are configured to be coupled to an impedance circuit of the bus, the impedance circuit being coupled between the high side output terminal and the low side output terminal and being configured to operably generate a differential output signal according to the high side output signal and the low side output signal; wherein the high side P-type region directly contacts the N-type semiconductor substrate and there is no insulating layer between the high side P-type region and the N-type semiconductor substrate; wherein the low side P-type region directly contacts the N-type semiconductor substrate and there is no insulating layer between the low side P-type region and the N-type semiconductor substrate.

In one embodiment, the high side diode structure includes: a high side NPN bipolar junction transistor (BJT) having a base and a collector which are electrically connected to each other; wherein the high side P-type region includes the base of the high side NPN BJT, whereas, the high side N-type region includes an emitter of the high side NPN BJT.

In one embodiment, the high side NPN BJT has a concentric zone structure, wherein the emitter, the base and the collector of the high side NPN BJT are arranged from inside out successively, wherein the high side NPN BJT further includes an isolation region having P-type conductivity, the isolation region being electrically connected to and encompassing the collector of the high side NPN BJT, wherein the isolation region directly contacts the N-type semiconductor substrate, to form the high side PN junction.

In one embodiment, the low side diode structure includes: a low side NPN BJT having a base and a collector which are electrically connected to each other; wherein the low side P-type region includes the base of the low side NPN BJT, whereas, the low side N-type region includes an emitter of the low side NPN BJT.

In one embodiment, the low side NPN BJT has a concentric zone structure, wherein the emitter, the base and the collector of the low side NPN BJT are arranged from inside out successively, wherein the low side NPN BJT further includes an isolation region having P-type conductivity, the isolation region being electrically connected to and encompassing the collector of the low side NPN BJT, wherein the isolation region directly contacts the N-type semiconductor substrate, to form the low side PN junction.

In one embodiment, the low side clamp circuit includes an N-type MOSFET having a source coupled to the low side P-type region, wherein a gate of the N-type MOSFET is biased to a predetermined control voltage, to prevent the voltage of the low side P-type region from being higher than the low side predetermined voltage, wherein a drain of the N-type MOSFET is electrically connected to the low side output terminal.

In one embodiment, the low side clamp circuit further includes: a Zener diode coupled between the gate and the source of the N-type MOSFET, the Zener diode being configured to operably ensure that the N-type MOSFET is turned ON; a resistor connected in series to a first voltage source, the resistor being configured to operably limit a current flowing through the Zener diode; and a capacitor coupled between the gate of the N-type MOSFET and a second voltage source, the capacitor being configured to operably reduce a coupling effect caused by a gate-drain parasitic capacitor of the N-type MOSFET; wherein a voltage supplied from the second voltage source is higher than a voltage supplied from the first voltage source.

In one embodiment, the low side clamp circuit includes a clamp NPN BJT having an emitter coupled to the low side P-type region, wherein a base of the clamp NPN BJT is biased to a predetermined control voltage, to prevent the voltage of the low side P-type region from being higher than the low side predetermined voltage, wherein a collector of the clamp NPN BJT is electrically connected to the low side output terminal.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the interrelations between the circuits and the layers, while the shapes, thicknesses, and widths of the circuits and the layers are not drawn in actual scale.

Figure 1A:
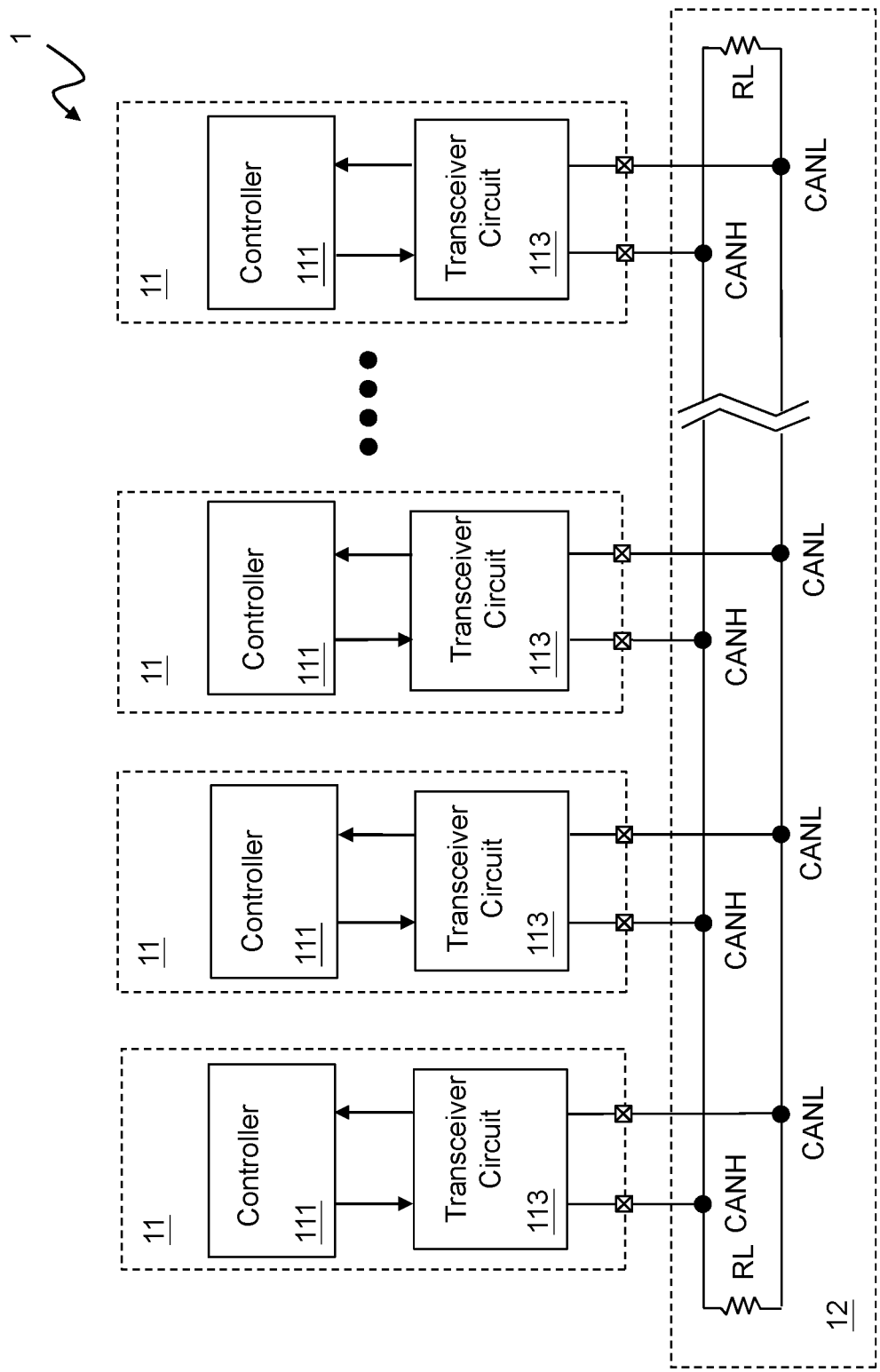
FIG. 1A shows a schematic diagram of a conventional controller area network (CAN) 1.
Figure 1B:
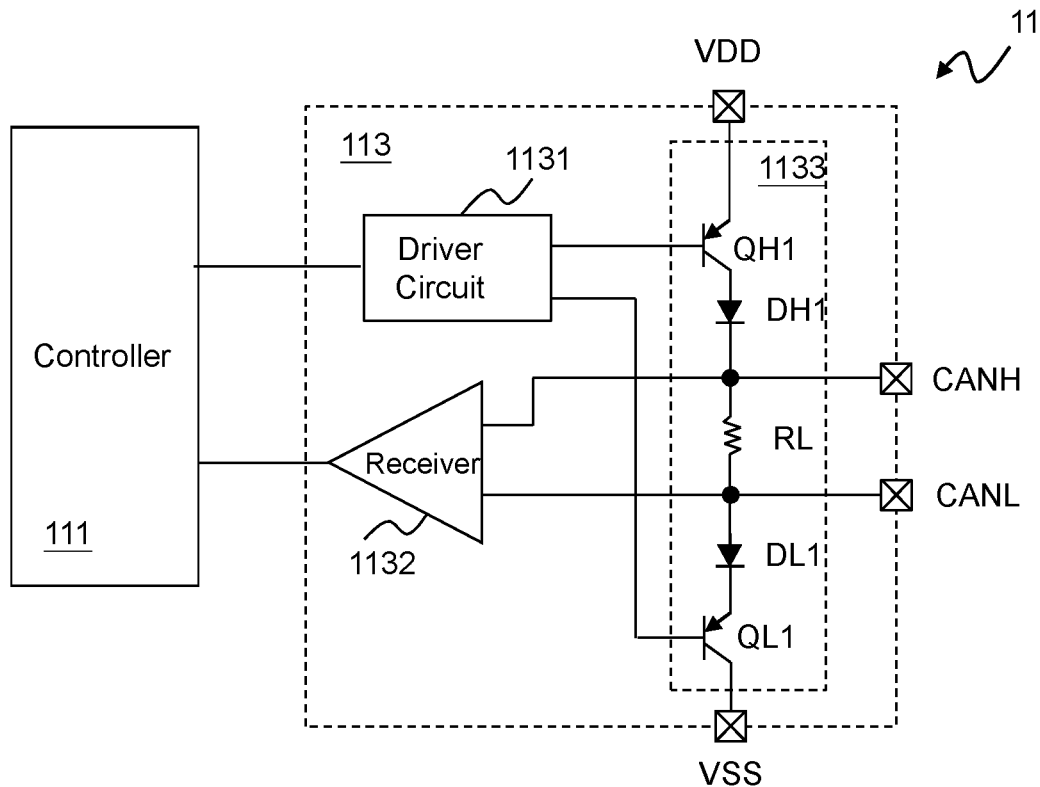
FIG. 1B shows a schematic diagram of a conventional data transceiver controller circuit 11 of a conventional CAN 1.
Figure 1C:
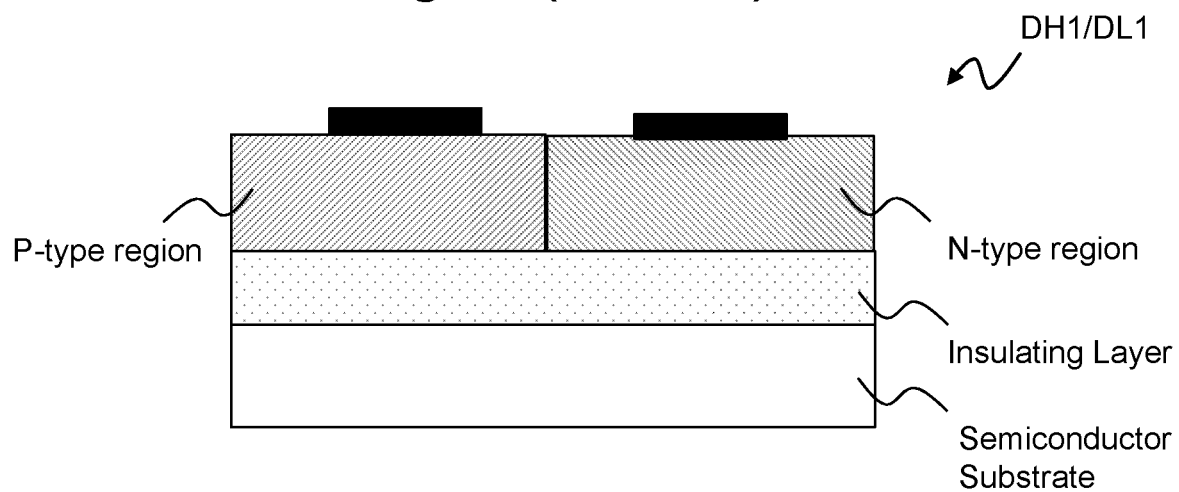
FIG. 1C shows a schematic diagram of a conventional diode structure DH1/DL1 of a conventional data transceiver controller circuit 11.
Figure 2A:
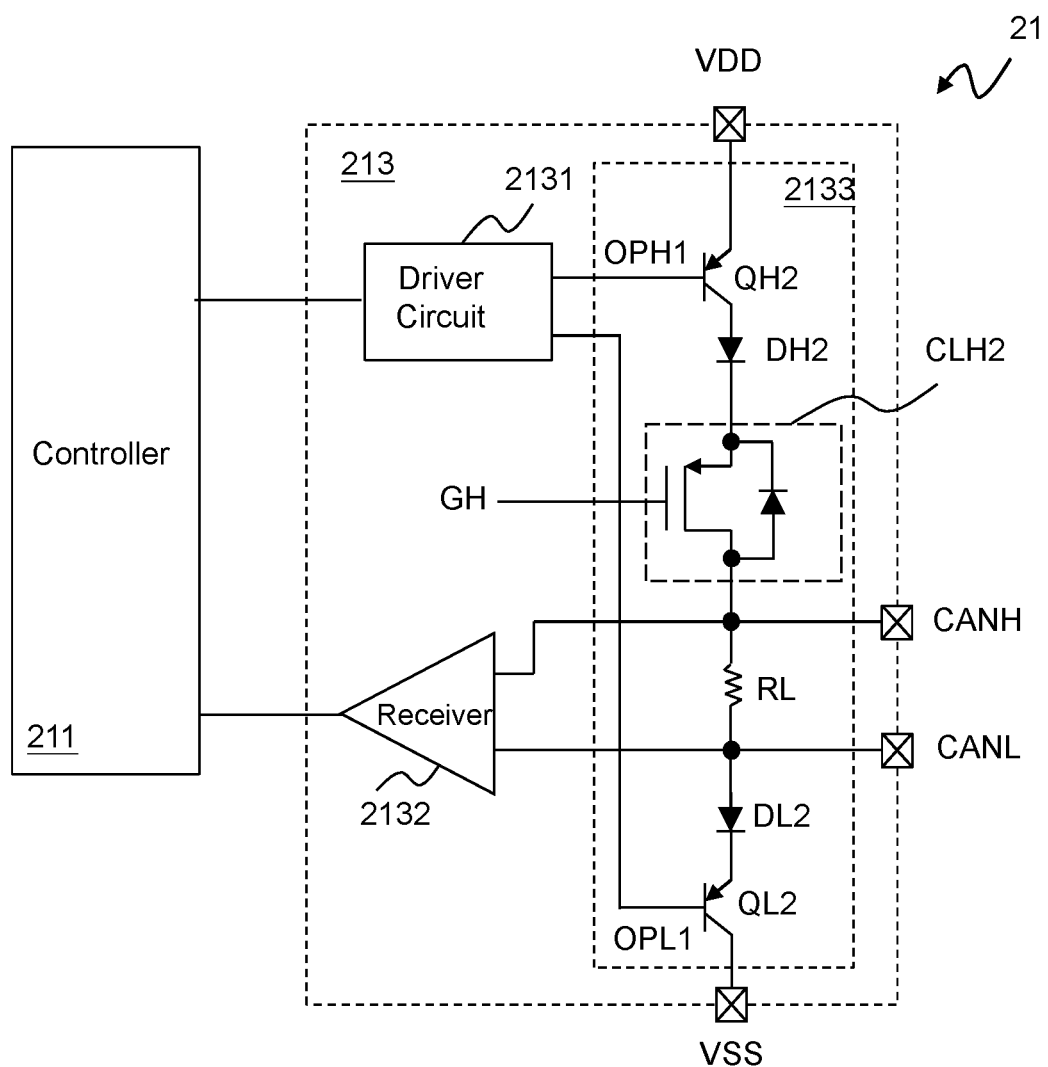
FIGS. 2A-2C show a first embodiment of the present invention.
Figure 2B:
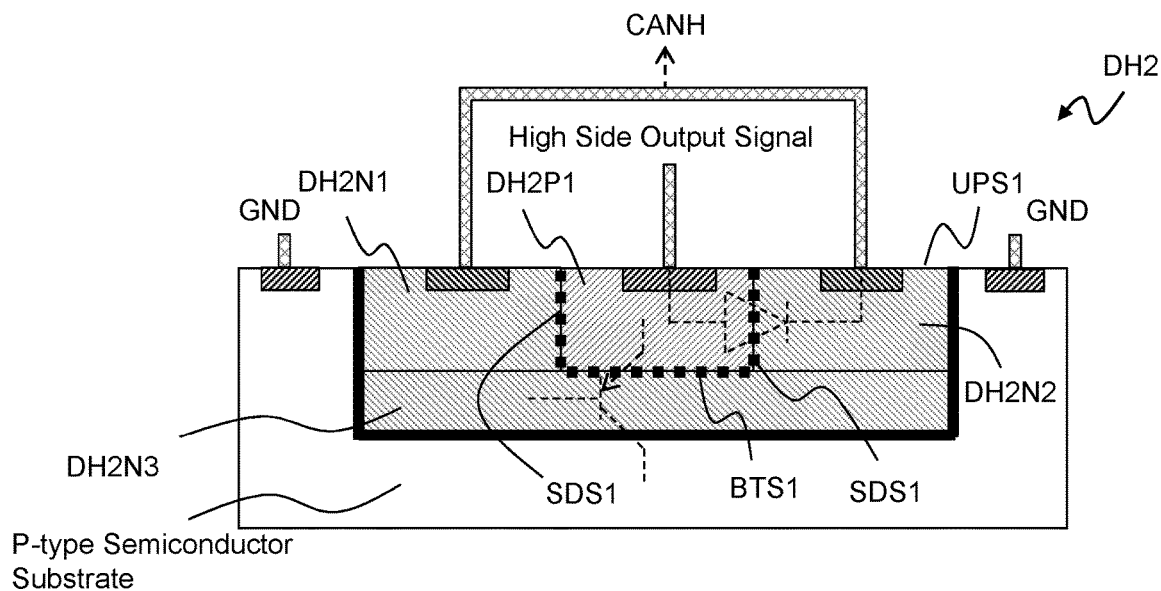
Figure 2C:
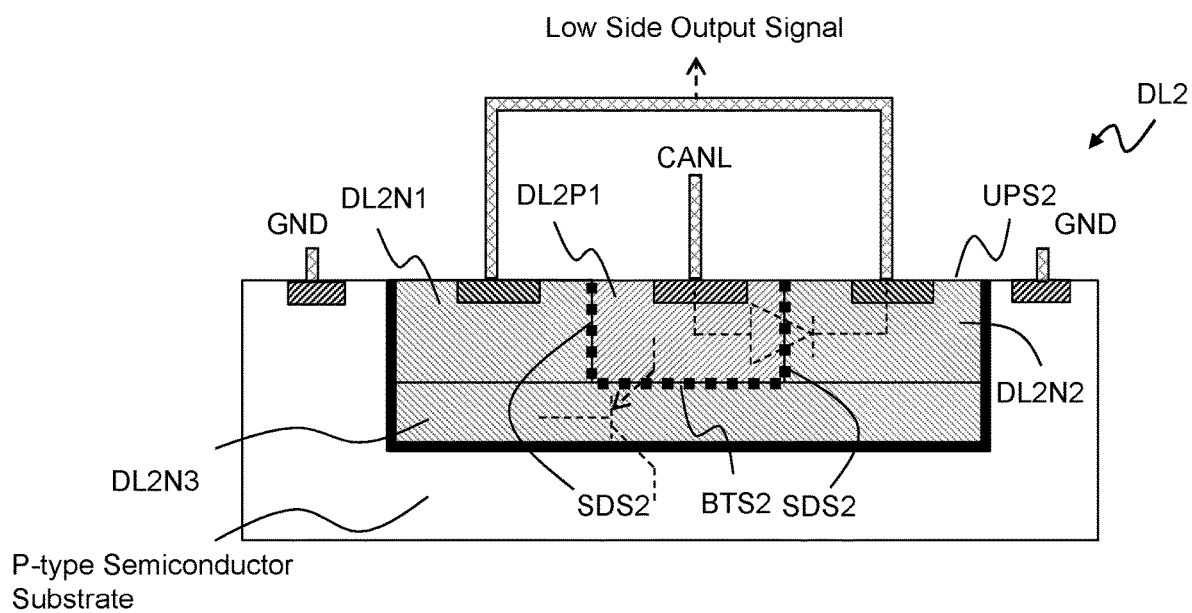

Please refer to FIGS. 2A-2C, which show a first embodiment of the present invention. FIG. 2A shows a schematic diagram of an output stage circuit 21 configured to operably transmit data via a bus. As shown in FIG. 2A, the output stage circuit 21 comprises a controller 211 and a transceiver circuit 213. The controller 211 controls the transceiver circuit 213, to transmit or receive data via the bus (referring to the above-mentioned bus 12). The bus has a high side signal line, a low side signal line and an impedance circuit coupled between the high side signal line and the low side signal line. For example, as shown in FIG. 1A, the impedance circuit can include, for example but not limited to, two resistors RL. Each resistor RL has its two ends electrically connected to the high side signal line and the low side signal line, respectively. The high side signal line has plural high side output terminals CANH, which are respectively coupled to the corresponding data transceiver controller circuits 21. The low side signal line has plural low side output terminals CANL, which are respectively coupled to the corresponding data transceiver controller circuits 21. On one hand, each data transceiver controller circuit 21 can generate a differential output signal between the corresponding high side output terminal CANH and the corresponding low side output terminal CANL, so as to transmit data. On the other hand, each data transceiver controller circuit 21 can receive a differential input signal via the corresponding high side output terminal CANH and the corresponding low side output terminal CANL, so as to receive data.

Please still refer to FIG. 2A. In the data transceiver controller circuit 21, the transceiver circuit 213 includes a driver circuit 2131, a receiver 2132 and an output stage circuit 2133. Different data transceiver controller circuits 21 can transmit or receive data via the bus during different periods. While one of the data transceiver controller circuits 21 is transmitting or receiving data, the rest of the data transceiver controller circuits 21 connected to the bus do not transmit or receive data via the bus, but it is required for the output stage circuit 2133 of each of these data transceiver controller circuits 21 to withstand a voltage difference between the high side signal line and the low side signal line. For safety, the output stage circuit 2133 needs to be able to withstand a voltage difference such as between +48V and −48V.

As shown in FIG. 2A, the controller 211 can control the driver circuit 2131 of the transceiver circuit 213, to operate a high side switch QH2 and a low side switch QL2 of the output stage circuit 2133, thus transmitting data via the corresponding output terminal CANH and the corresponding low side output terminal CANL. On the other hand, through the receiver 2132, each data transceiver controller circuit 21 can receive a differential input signal via the corresponding high side output terminal CANH and the corresponding low side output terminal CANL, so as to receive data.

Please still refer to FIG. 2A. The output stage circuit 2133 configured to operably transmit data via a bus is formed on a P-type semiconductor substrate. The output stage circuit 2133 is configured to operably generate a differential output signal between the high side output terminal CANH and the low side output terminal CANL which are connected to the bus. The output stage circuit 2133 comprises a high side switch QH2, a high side diode structure DH2, a high side clamp circuit CLH2, a low side switch QL2 and a low side diode structure DL2. The high side switch QH2 can be, for example but not limited to, a PNP bipolar junction transistor (BJT) as shown in FIG. 2A. The high side switch QH2 is configured to operate according to a high side operation signal OPH1, to generate a high side output signal (in this embodiment, the high side output signal is illustrated as a collector voltage of the PNP BJT). The high side switch QH2 is electrically connected to an internal voltage VDD (in this embodiment, this is illustrated by that the emitter of the PNP BJT is electrically connected to the internal voltage VDD). The internal voltage VDD can be, for example but not limited to, 5V.

The high side diode structure DH2 is connected in series to the high side switch QH2. The high side diode structure DH2 is configured to operably transmit the high side output signal and to block a reverse bias voltage. As shown in FIG. 2B, the high side diode structure DH2 has a high side P-type region DH2P1 and a high side N-type region. The high side N-type region includes high side N-type sub-regions DH2N1, DH2N2 and DH2N3. The high side N-type sub-region DH2N3 can be, for example but not limited to, an N-type buried layer formed on a P-type semiconductor substrate; "buried layer" is well known to those skilled in the art, so the details thereof are not redundantly explained here. The high side P-type region DH2P1 is electrically connected to the high side switch QH2. The high side P-type region DH2P1 is configured to operably receive the high side output signal. The high side N-type region is coupled to the high side output terminal CANH. The high side N-type region is configured to operably transmit the high side output signal to the high side output terminal CANH. Beneath a top surface UPS1 of the P-type semiconductor substrate, the high side N-type region (which includes the high side N-type sub-regions DH2N1, DH2N2 and DH2N3) encompasses a lateral side SDS1 and a bottom side BTS1 of the high side P-type region DH2P1, to form a high side PN junction (as indicated by a black thick dotted line in FIG. 2B). And, a high side substrate PN junction (as indicated by a black thick solid line in FIG. 2B) is formed between the high side N-type region and the P-type semiconductor substrate. The P-type semiconductor substrate is electrically connected to ground voltage level GND. The high side N-type region directly contacts the P-type semiconductor substrate and there is no insulating layer between the high side N-type region and the P-type semiconductor substrate. In one embodiment, the high side diode structure DH2 can be manufactured via a standard CMOS manufacturing process, which does not include a silicon on insulator (SOI) manufacturing process.

The voltage of the high side N-type region needs to be maintained not lower than a high side predetermined voltage, to prevent a parasitic PNP BJT (as indicated by the thin dashed line PNP BJT in FIG. 2B) from being turned ON under any situations. For example, the parasitic PNP BJT may be turned ON under a situation where a huge current flows through the high side diode structure DH2. For another example, the parasitic PNPBJT may be turned ON under a situation where a voltage at the high side output terminal CANH is a negative voltage. To elaborate in more detail, under a situation where a voltage at the high side output terminal CANH is a negative voltage, because a voltage of the base (i.e., the high side N-type sub-region DH2N3) of the parasitic PNPBJT is lower than a voltage of the collector (i.e., the P-type semiconductor substrate) which is equal to 0V or ground voltage level GND (in this embodiment and other embodiments, the P-type semiconductor substrate is electrically connected to 0V or ground voltage level GND), the parasitic PNPBJT will be turned ON. According to the present invention, the high side clamp circuit CLH2 is provided, which is connected in series to the high side N-type region. The high side clamp circuit CLH2 is configured to operably clamp a voltage of the high side N-type region, to ensure the voltage of the high side N-type region not to be lower than the high side predetermined voltage, so as to prevent the parasitic PNPBJT formed between the high side diode structure DH2 and the P-type semiconductor substrate from being turned ON.

For example, as shown in FIG. 2A, the high side clamp circuit CLH2 includes a P-type MOS field effect transistor (FET), which has a source coupled to the high side N-type region, a gate which is biased to a predetermined control voltage GH, to prevent the voltage of the high side N-type region from being lower than the high side predetermined voltage, and a drain which is electrically connected to the high side output terminal CANH. The predetermined control voltage GH can be, for example but not limited to, 0V or ground voltage level GND. For example, when a gate-source voltage Vgs of the P-type MOSFET is higher than 1V, the P-type MOSFET is turned OFF; in this case, when the predetermined control voltage GH is 0V and when the voltage of the high side N-type region is not lower than the high side predetermined voltage (e.g., 1V), the P-type MOSFET remains turned ON. In contrast, when the voltage of the high side N-type region is lower than the high side predetermined voltage (e.g., 1V), the P-type MOSFET is turned OFF, thus preventing the voltage of the high side N-type region from being lower than the high side predetermined voltage (e.g., 1V). As thus, this embodiment can further protect the circuitry to avoid turning ON the parasitic PNP BJT.

Note that the so-called "standard CMOS manufacturing process", as readily undertood by those skilled in this art, is meant to indicate a manufacturing process for forming semiconductor devices on a silicon substrate, which includes oxidation, lithography, etching, ion implantation and diffusion processes, but excludes specific manufacturing process such as an SOI manufacturing process. Such standard CMOS manufacturing process is well known to those skilled in the art, so the details thereof are not redundantly explained here.

The high side diode structure DH2 is configured to operably block a reverse bias voltage. Note that the term "reverse bias voltage" as described in the above is a characteristic of a diode. For an ideal diode, there is zero resistance between its two electrodes (i.e., cathode and anode) under forward conduction, whereas, there is infinitely great resistance between the two electrodes under backward conduction; that is, current is allowed to flow through the diode only along one single direction. With respect to s semiconductor device, in a diode wherein a PN junction is formed by a P-type region connected with an N-type region, the P-type region functions as an anode whereas the N-type region functions as a cathode. A "reverse bias voltage" is a negative voltage (i.e., relatively to the cathode) applied to the anode, which is well known to those skilled in the art, so the details thereof are not redundantly explained here.

The low side switch QL2 can be, for example but not limited to, a PNP bipolar junction transistor (BJT) as shown in FIG. 2A. The low side switch QL2 is configured to operate according to a low side operation signal OPL1, to generate a low side output signal (in this embodiment, the low side output signal is illustrated by an emitter voltage of the PNP BJT). The low side switch QL2 is electrically connected to a reference voltage VSS (in this embodiment, this is illustrated by that the collecter of the low side switch QL2 is electrically connected to the reference voltage VSS). The reference voltage VSS can be, for example but not limited to, 0V or ground voltage level GND.

As shown in FIG. 2A, the low side diode structure DL2 is connected in series to the low side switch QL2. The low side diode structure DL2 is configured to operably transmit the low side output signal and to block a reverse bias voltage. As shown in FIG. 2C, the low side diode structure DL2 has a low side P-type region DL2P1 and a low side N-type region. The low side N-type region includes low side N-type sub-regions DL2N1, DL2N2 and DL2N3. The low side N-type sub-region DL2N3 can be, for example but not limited to, an N-type buried layer formed on a P-type semiconductor substrate; "buried layer" is well known to those skilled in the art, so the details thereof are not redundantly explained here. The low side N-type region is electrically connected to the low side switch QL2. The low side N-type region is configured to operably receive the low side output signal. The low side P-type region DL2P1 is coupled to the low side output terminal CANL. The low side P-type region DL2P1 is configured to operably transmit the low side output signal to the low side output terminal CANL. Beneath a top surface UPS2 of the P-type semiconductor substrate, the low side N-type region encompasses a lateral side SDS2 and a bottom side BTS2 of the low side P-type region DH2P1, to form a low side PN junction (as indicated by a black thick dotted line in FIG. 2C). And, a low side substrate PN junction (as indicated by a black thick solid line in FIG. 2C) is formed between the low side N-type region and the P-type semiconductor substrate. The resistors RL of the impedance circuits of the bus are coupled between the high side output terminal CANH and the low side output terminal CANL, to respectively generate differential output signals according to the high side output signal and the low side output signal. The low side N-type region directly contacts the P-type semiconductor substrate and there is no insulating layer between the low side N-type region and the P-type semiconductor substrate. In one embodiment, the low side diode structure DL2 can be manufactured via a standard CMOS manufacturing process, which does not include a silicon on insulator (SOI) manufacturing process.

Note that in the above description that the low side diode structure DL2 is configured to operably block a reverse bias voltage, the term "reverse bias voltage" is with respect to the low side diode structure DL2.

Figure 3A:
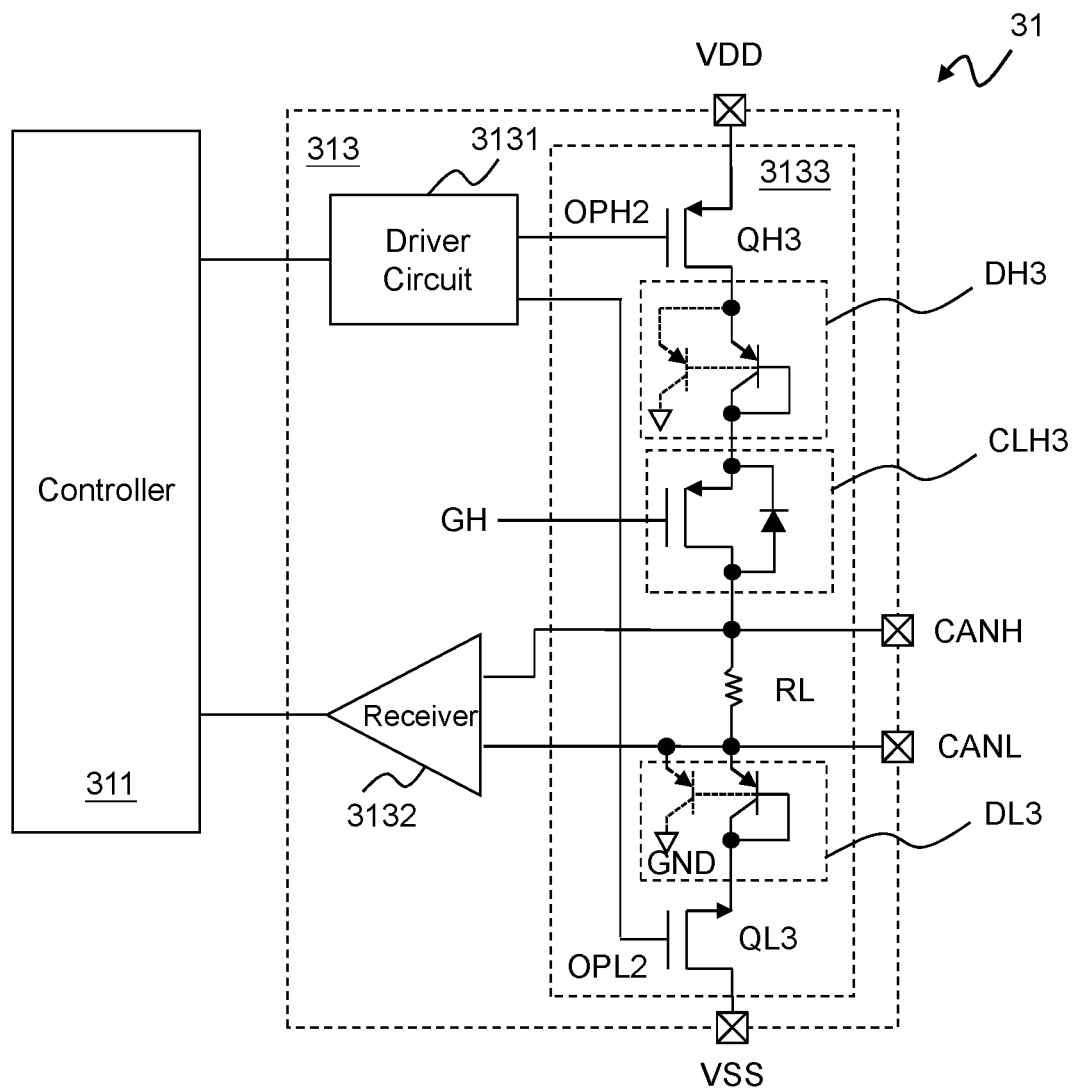
FIGS. 3A-3G show a second embodiment of the present invention.

Please refer to FIGS. 3A-3G, which show a second embodiment of the present invention. FIG. 3A shows a schematic diagram of an output stage circuit 31 configured to operably transmit data via a bus. As shown in FIG. 3A, the output stage circuit 31 comprises a controller 311 and a transceiver circuit 313. The controller 311 can control the transceiver circuit 313, such that the output stage circuit 31 can transmit or receive data via the bus (referring to the above-mentioned bus 12). The bus has a high side signal line, a low side signal line and an impedance circuit coupled between the high side signal line and the low side signal line. For example, as shown in FIG. 1A, the impedance circuit can include, for example but not limited to, two resistors RL. Each resistor RL has its two ends electrically connected to the high side signal line and the low side signal line, respectively. The high side signal line has plural high side output terminals CANH, which are respectively coupled to the corresponding data transceiver controller circuits 31. The low side signal line has plural low side output terminals CANL, which are respectively coupled to the corresponding data transceiver controller circuits 31. On one hand, each data transceiver controller circuit 31 can generate a differential output signal between the corresponding high side output terminal CANH and the corresponding low side output terminal CANL, so as to transmit data. On the other hand, each data transceiver controller circuit 31 can receive a differential input signal via the corresponding high side output terminal CANH and the corresponding low side output terminal CANL, so as to receive data.

Please still refer to FIG. 3A. In the data transceiver controller circuit 31, the transceiver circuit 313 includes a driver circuit 3131, a receiver 3132 and an output stage circuit 3133. Different data transceiver controller circuits 31 can transmit or receive data via the bus during different periods. While one of the data transceiver controller circuits 31 is transmitting or receiving data, the rest of the data transceiver controller circuits 31 connected to the bus do not transmit or receive data via the bus. However, for the rest of the data transceiver controller circuits 31 that do not transmit or receive data via the bus, it is required for each output stage circuit 3133 of these data transceiver controller circuits 31 to withstand a voltage across the high side signal line and the low side signal line. For the sake of safety, it is required for each output stage circuit 3133 to withstand a relatively greater difference between positive and negative voltage such as a voltage difference between +48V to −48V.

As shown in FIG. 3A, the controller 311 can control the driver circuit 3131 of the transceiver circuit 313, to operate a high side switch QH3 and a low side switch QL3 of the output stage circuit 3133, so as to transmit data via a corresponding output terminal CANH and a corresponding low side output terminal CANL. On the other hand, through the receiver 3132, each data transceiver controller circuit 31 can receive a differential input signal via the corresponding high side output terminal CANH and the corresponding low side output terminal CANL, so as to receive data.

Please still refer to FIG. 3A. The output stage circuit 3133 configured to operably transmit data via a bus is formed on a P-type semiconductor substrate. The output stage circuit 3133 is configured to operably generate a differential output signal between a high side output terminal CANH and a low side output terminal CANL which are connected to the bus. The output stage circuit 3133 comprises a high side switch QH3, a high side diode structure DH3, a high side clamp circuit CLH3, a low side switch QL3 and a low side diode structure DL3. The high side switch QH3 can be, for example but not limited to, a P-type MOS field effect transistor (FET) as shown in FIG. 3A. The high side switch QH3 is configured to operate according to a high side operation signal OPH2 received by a gate of the P-type MOSFET, to generate a high side output signal (in this embodiment, the high side output signal is illustrated by a drain voltage of the P-type MOSFET). The high side switch QH3 is electrically connected to an internal voltage VDD (in this embodiment, this is illustrated by that the source of the high side switch QH3 is electrically connected to the internal voltage VDD). The internal voltage VDD can be, for example but not limited to, 5V.

The high side diode structure DH3 is connected in series to the high side switch QH3. The high side diode structure DH3 is configured to operably transmit the high side output signal and to block a reverse bias voltage. As shown in FIG. 3A, the high side diode structure DH3 can include, for example but not limited to, a high side PNP BJT having a base and a collector which are electrically connected to each other, wherein the P-type region includes an emitter of the high side PNP BJT, and the N-type region includes the base of the high side PNP BJT. As shown in FIG. 3A, in the high side diode structure DH3, the dashed line PNP BJT illustrates a parasitic PNP BJT of the high side PNP BJT. A collector of the parasitic PNP BJT is the P-type semiconductor substrate and is electrically connected to the ground voltage level GND.

Figure 3B:
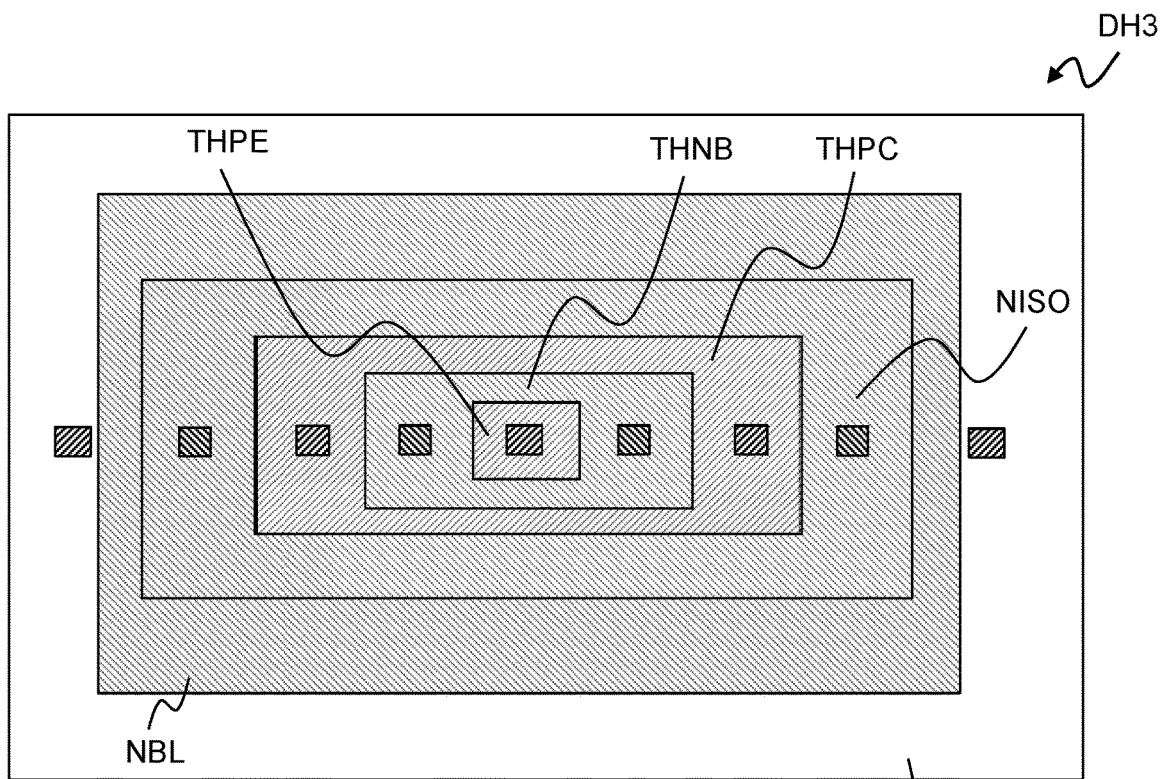
Figure 3C:
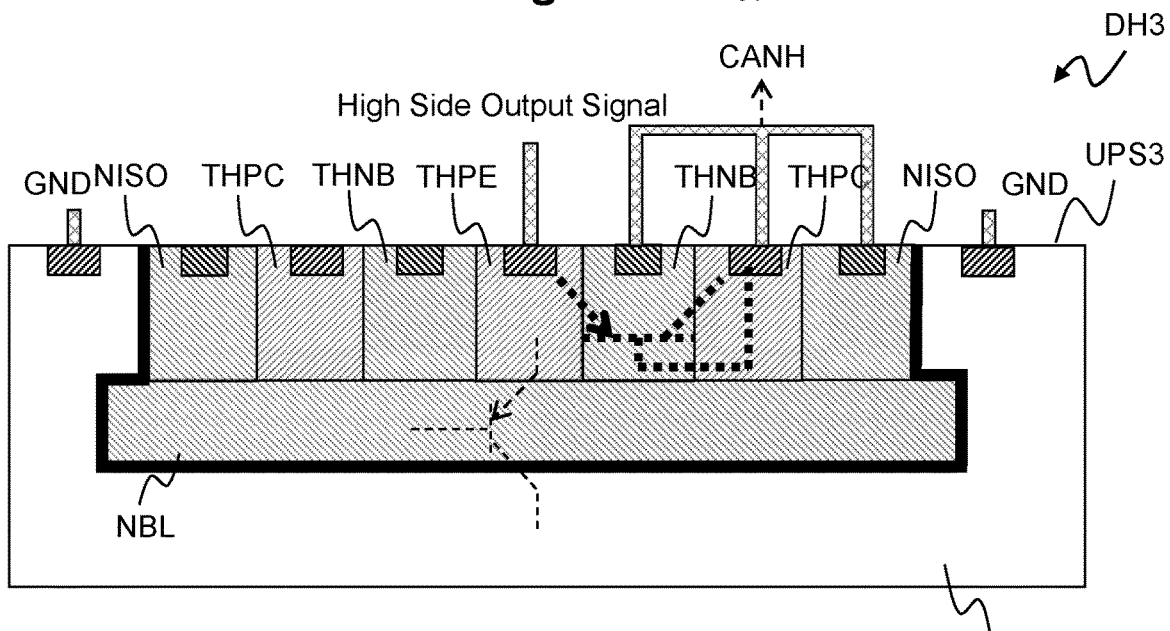

FIG. 3B shows a top view of a high side diode structure DH3, while FIG. 3C shows a cross-sectional view of a high side diode structure DH3. As shown in FIGS. 3B-3C, the high side diode structure DH3 includes a high side PNP BJT, as indicated by a transistor symbol of black thick dotted line in FIG. 3C. In one embodiment, preferably, as shown in FIG. 3B, the high side PNP BJT has a concentric zone structure. The P-type emitter THPE, the N-type base THNB and the P-type collector THPC of the high side PNP BJT are arranged from inside out successively. The high side PNP BJT further includes an isolation region NISO and an N-type buried layer NBL. The isolation region NISO and the N-type buried layer NBL have N-type conductivity. The isolation region NISO and the N-type buried layer NBL are located outside of the collector THPC; the isolation region NISO and the N-type buried layer NBL are electrically connected to and encompass the collector THPC. The isolation region NISO and the N-type buried layer NBL directly contact the P-type semiconductor substrate, to form the high side PN junction (as indicated by the black thick solid line in FIG. 3C). The isolation region NISO and the N-type buried layer NBL directly contact the P-type semiconductor substrate and there is no insulating layer between the isolation region NISO and the N-type buried layer NBL and the P-type semiconductor substrate.

As shown in FIG. 3C, the base THNB of the high side PNP BJT is electrically connected to the collector THPC of the high side PNP BJT and the isolation region NISO. The high side P-type region of the high side diode structure DH3 includes the emitter THPE of the high side PNP BJT. The high side N-type region of the high side diode structure DH3 includes the base THNB of the high side PNP BJT, the isolation region NISO and the N-type buried layer NBL. The high side P-type region which includes the emitter THPE is electrically connected to the high side switch QH3, to receive the high side output signal. The high-side N-type region is coupled to the high side output terminal CANH, to transmit the high side output signal to the high side output terminal CANH. Beneath a top surface UPS3 of the P-type semiconductor substrate, the high side N-type region encompasses a lateral side and a bottom side of the high side P-type region, to form a high side PN junction. A high side substrate PN junction is formed between the high side N-type region and the P-type semiconductor substrate. The high side N-type region directly contacts the P-type semiconductor substrate and there is no insulating layer between the high side N-type region and the P-type semiconductor substrate. In one embodiment, the high side diode structure DH3 can be manufactured via a standard CMOS manufacturing process, which does not include a silicon on insulator (SOI) manufacturing process.

The voltage of the high side N-type region needs to be maintained not lower than a high side predetermined voltage, to prevent a parasitic PNPBJT (as indicated by the thin dashed line PNPBJT in FIG. 3C) from being turned ON under any situations. For example, a parasitic PNPBJT may be turned ON under a situation where a huge current flows through the high side diode structure DH3. For another example, a parasitic PNPBJT may be turned ON under a situation where a voltage at the high side output terminal CANH is a negative voltage. To elaborate in more detail, under a situation where a voltage at the high side output terminal CANH is a negative voltage, because a voltage of the base (i.e., the N-type buried layer NBL) of the parasitic PNPBJT will be lower than a voltage of the collector (i.e., the P-type semiconductor substrate) which is equal to 0V or ground voltage level GND, the parasitic PNPBJT will be turned ON. According to the present invention, the high side clamp circuit CLH3 is provided, which is connected in series to the high side N-type region. The high side clamp circuit CLH3 is configured to operably clamp a voltage of the high side N-type region, to ensure the voltage of the high side N-type region not to be lower than a high side predetermined voltage, thereby preventing the parasitic PNPBJT formed between the high side diode structure DH3 and the P-type semiconductor substrate from being turned ON.

For example, as shown in FIG. 3A, the high side clamp circuit CLH3 includes a P-type MOS field effect transistor (FET) having a source coupled to the high side N-type region, a gate which is biased to a predetermined control voltage GH, to prevent the voltage of the high side N-type region from being lower than the high side predetermined voltage, and a drain which is electrically connected to the high side output terminal CANH. The predetermined control voltage GH can be, for example but not limited to, 0V or ground voltage level GND. For example, when a gate-source voltage Vgs of the P-type MOSFET is higher than 1V, the P-type MOSFET is turned OFF. Accordingly, when the predetermined control voltage GH is 0V and when the voltage of the high side N-type region is not lower than the high side predetermined voltage (e.g., 1V), the P-type MOSFET remains turned ON. In contrast, when the voltage of the high side N-type region is lower than the high side predetermined voltage (e.g., 1V), the P-type MOSFET is turned OFF, thus preventing the voltage of the high side N-type region from being lower than the high side predetermined voltage (e.g., 1V). As thus, this embodiment can further protect the circuitry to avoid turning ON the parasitic PNP BJT.

Note that in the above description that the high side diode structure DH3 is configured to operably block a reverse bias voltage, the term "reverse bias voltage" is with respect to the high side diode structure DH3.

The low side switch QL3 can be, for example but not limited to, an N-type MOS field effect transistor (FET) as shown in FIG. 3A. The low side switch QL3 is configured to operate according to a low side operation signal OPL2 received by a gate of the N-type MOSFET, to generate a low side output signal (in this embodiment, the low side output signal is illustrated by a source voltage of the N-type MOSFET). The low side switch QL3 is electrically connected to a reference voltage VSS (in this embodiment, this is illustrated by that the drain of the low side switch QL3 is electrically connected to the reference voltage VSS). The reference voltage VSS can be, for example but not limited to, 0V or ground voltage level GND.

Figure 3D:
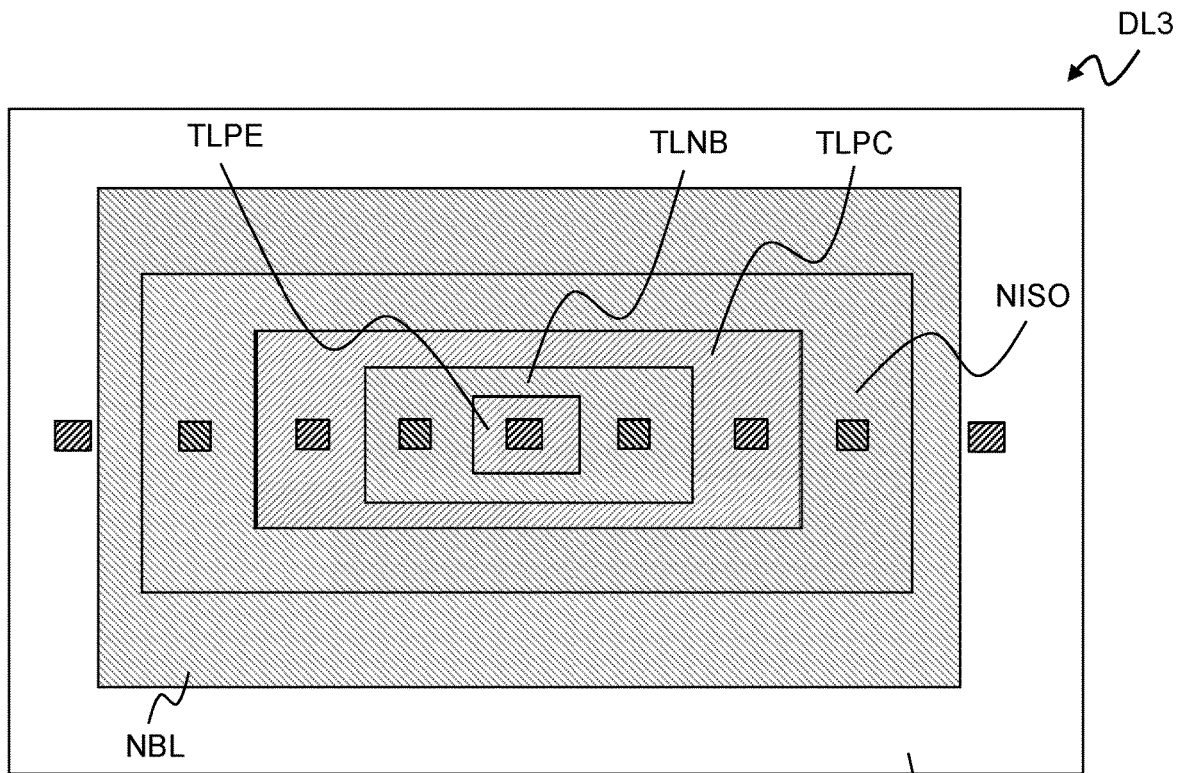
Figure 3E:
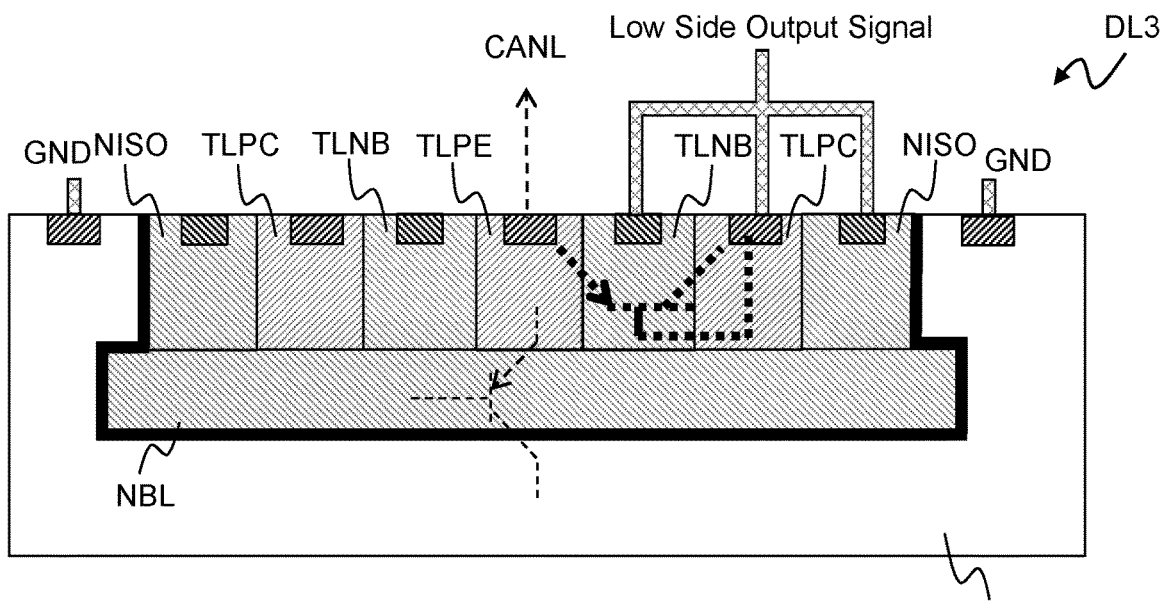

As shown in FIG. 3A, the low side diode structure DL3 is connected in series to the low side switch QL3. The low side diode structure DL3 is configured to operably transmit the low side output signal and to block a reverse bias voltage. FIG. 3D shows a top view of a low side diode structure DL3, while FIG. 3E shows a cross-sectional view of a low side diode structure DL3. As shown in FIGS. 3D-3E, the low side diode structure DL3 further includes a low side PNP BJT, as indicated by a transistor symbol of black thick dotted line in FIG. 3E. In one embodiment, preferably, as shown in FIG. 3D, the low side PNP BJT has a concentric zone structure. The P-type emitter TLPE, the N-type base TLNB and the P-type collector TLPC of the low side PNP BJT are arranged from inside out successively. The low side PNP BJT further includes an isolation region NISO and an N-type buried layer NBL. The isolation region NISO and the N-type buried layer NBL have N-type conductivity. The isolation region NISO and the N-type buried layer NBL are located outside of the collector TLPC; the isolation region NISO and the N-type buried layer NBL are electrically connected to and encompass the collector TLPC. The isolation region NISO and the N-type buried layer NBL directly contact the P-type semiconductor substrate, to form the low side PN junction (as indicated by the black thick solid line in FIG. 3E). The isolation region NISO and the N-type buried layer NBL directly contact the P-type semiconductor substrate and there is no insulating layer between the isolation region NISO and the N-type buried layer NBL and the P-type semiconductor substrate. The P-type semiconductor substrate can be electrically connected to, for example but not limited to, ground voltage level GND.

As shown in FIG. 3E, the base TLNB of the low side PNP BJT is electrically connected to the collector TLPC of the low side PNP BJT and the isolation region NISO. A low side P-type region of the low side diode structure DL3 includes the emitter TLPE of the low side PNP BJT. A low side N-type region of the low side diode structure DL3 includes the base TLNB of the low side PNP BJT, the isolation region NISO and the N-type buried layer NBL. The low side P-type region which includes the emitter TLPE is electrically connected to the low side switch QL3, to receive the low side output signal. The low side N-type region is coupled to the low side output terminal CANL, to transmit the low side output signal to the low side output terminal CANL. Beneath a top surface of the P-type semiconductor substrate, the low side N-type region encompasses a lateral side and a bottom side of the low side P-type region, to form a low side PN junction. The low side substrate PN junction is formed between the low side N-type region and the P-type semiconductor substrate. The low side N-type region directly contacts the P-type semiconductor substrate and there is no insulating layer between the low side N-type region and the P-type semiconductor substrate. In one embodiment, the low side diode structure DL3 can be manufactured via a standard CMOS manufacturing process, which does not include a silicon on insulator (SOI) manufacturing process.

The low side switch QL3 can be, for example but not limited to, an P-type MOS field effect transistor (FET) as shown in FIG. 3A. The low side switch QL3 is configured to operate according to a low side operation signal OPL2 received by a gate of the P-type MOSFET, to generate a low side output signal (in this embodiment, the low side output signal is illustrated by a source voltage of the P-type MOSFET). The low side switch QL3 is electrically connected to a reference voltage VSS (in this embodiment, the low side output signal is illustrated by a drain being electrically connected to the reference voltage VSS). The reference voltage VSS can be, for example but not limited to, 0V or ground voltage level GND.

Note that in the above description that the low side diode structure DL3 is configured to operably block a reverse bias voltage, the term "reverse bias voltage" is with respect to the low side diode structure DL3.

Figure 3F:
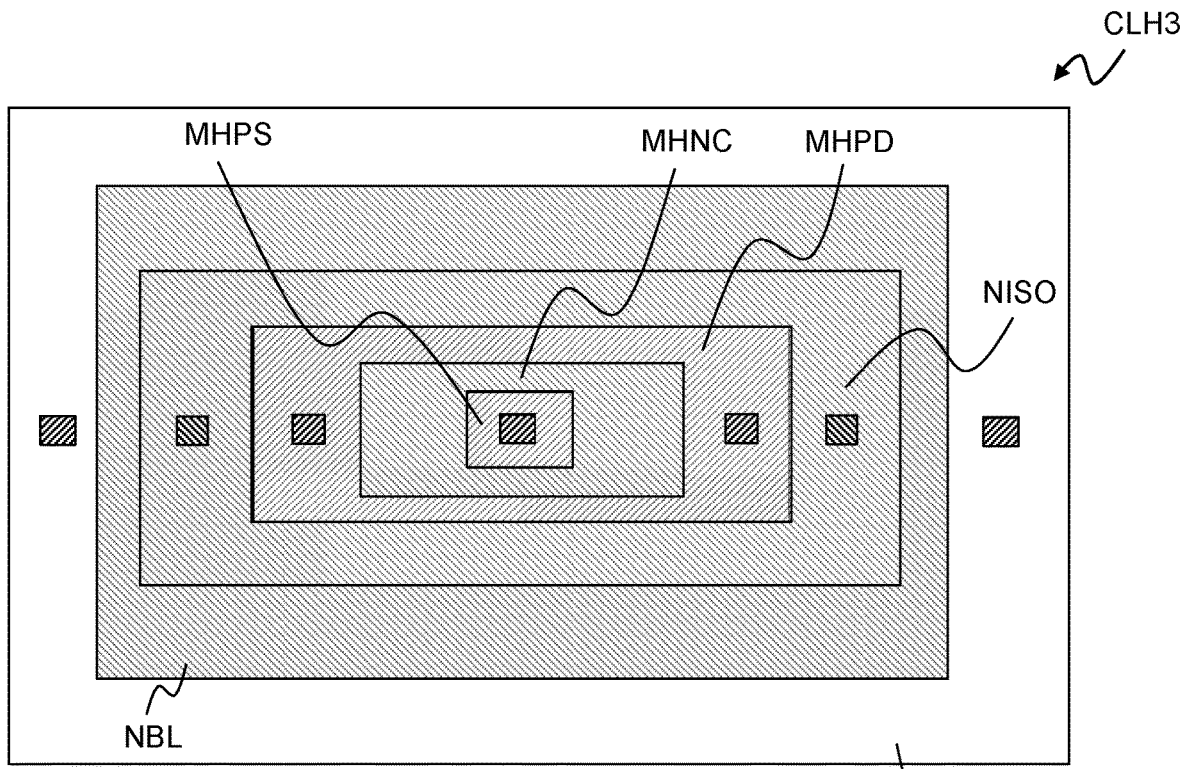
Figure 3G:
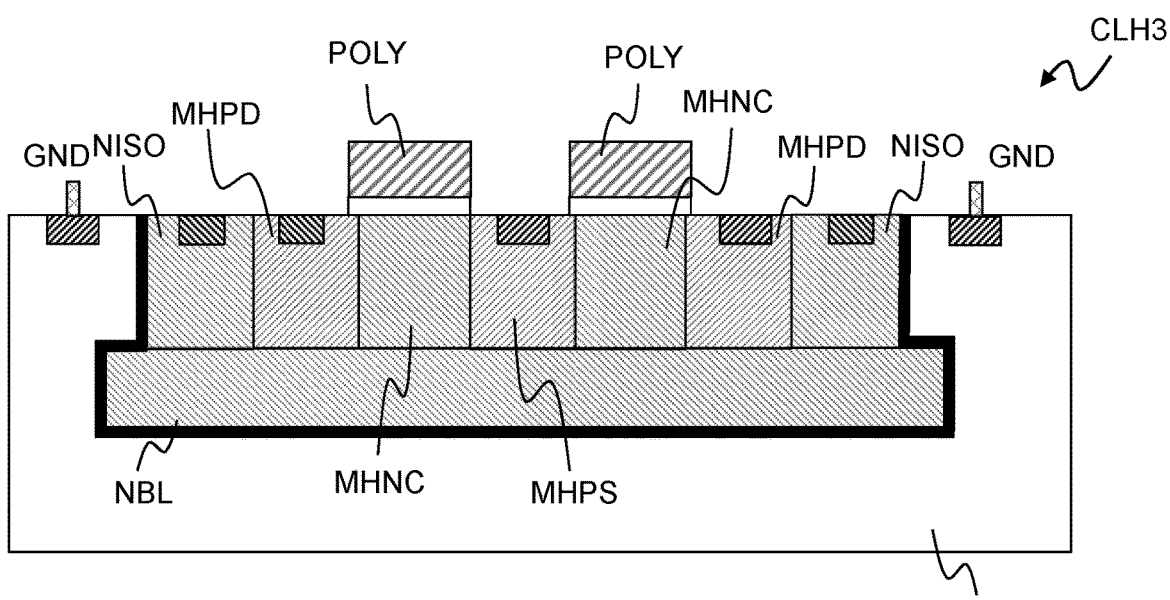

FIG. 3F shows a top view of a high side clamp circuit CLH3, while FIG. 3G shows a cross-sectional view of a high side clamp circuit CLH3. As shown in FIGS. 3F-3G, the high side clamp circuit CLH3 includes a P-type MOSFET having a gate POLY. In one embodiment, preferably, as shown in FIG. 3F, the high side clamp circuit CLH3 has a concentric zone structure. The P-type source MHPS, the N-type channel MHNC and the P-type drain MHPD of the high side clamp circuit CLH3 are arranged from inside out successively. The high side clamp circuit CLH3 further includes an isolation region NISO and an N-type buried layer NBL. The isolation region NISO and the N-type buried layer NBL have N-type conductivity. The isolation region NISO and the N-type buried layer NBL are located outside of the P-type drain MHPD; the isolation region NISO and the N-type buried layer NBL are electrically connected to and encompass the P-type drain MHPD. The isolation region NISO and the N-type buried layer NBL directly contact the P-type semiconductor substrate, to form the high side PN junction (as indicated by the black thick solid line in FIG. 3G). The isolation region NISO and the N-type buried layer NBL directly contact the P-type semiconductor substrate and there is no insulating layer between the isolation region NISO and the N-type buried layer NBL and the P-type semiconductor substrate. In one embodiment, the high side clamp circuit CLH3 can be manufactured via a standard CMOS manufacturing process, which does not include a silicon on insulator (SOI) manufacturing process.

Figure 4:
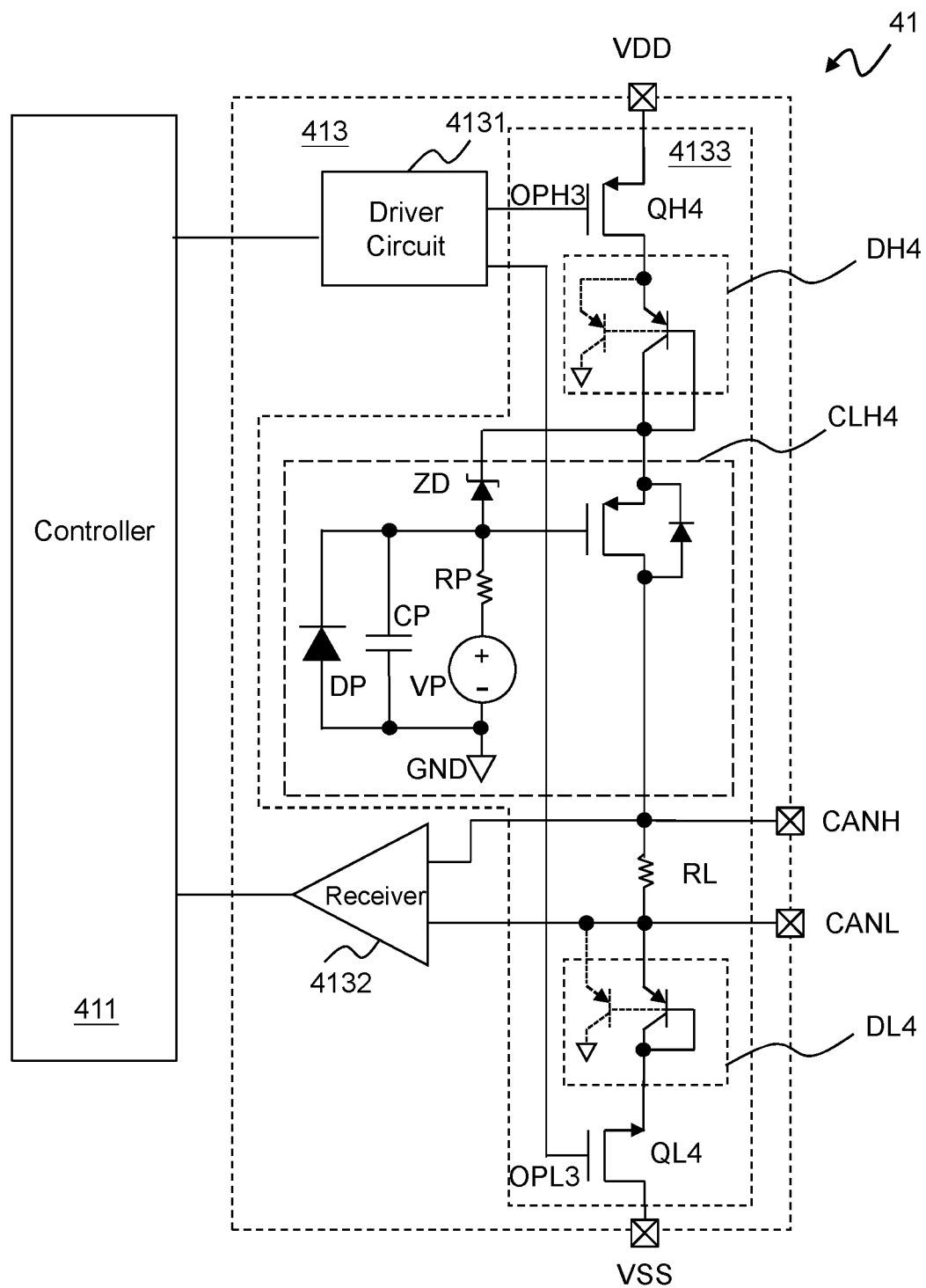
FIG. 4 shows a third embodiment of the present invention.

Please refer to FIG. 4, which shows a third embodiment of the present invention. FIG. 4 shows a schematic diagram of an output stage circuit 41 configured to operably transmit data via a bus. As shown in FIG. 4, the output stage circuit 41 comprises a controller 411 and a transceiver circuit 413. The controller 411 can control the transceiver circuit 413, such that the output stage circuit 41 can transmit or receive data via the bus (referring to the above-mentioned bus 12). On one hand, each data transceiver controller circuit 41 can generate a differential output signal between the corresponding high side output terminal CANH and the corresponding low side output terminal CANL, so as to transmit data. On the other hand, each data transceiver controller circuit 41 can receive a differential input signal via the corresponding high side output terminal CANH and the corresponding low side output terminal CANL, so as to receive data.

Please still refer to FIG. 4. In the data transceiver controller circuit 41, the transceiver circuit 413 includes a driver circuit 4131, a receiver 4132 and an output stage circuit 4133. As shown in FIG. 4, the controller 411 can control the driver circuit 4131 of the transceiver circuit 413, to operate a high side switch QH4 and a low side switch QL4 of the output stage circuit 4133, thus transmitting data via a corresponding output terminal CANH and a corresponding low side output terminal CANL. On the other hand, through the receiver 4132, each data transceiver controller circuit 11 can receive a differential input signal via the corresponding high side output terminal CANH and the corresponding low side output terminal CANL, so as to receive data.

Please still refer to FIG. 4. The output stage circuit 4133 configured to operably transmit data via a bus is formed on a P-type semiconductor substrate. The output stage circuit 4133 is configured to operably generate a differential output signal between a high side output terminal CANH and a low side output terminal CANL which are connected to the bus. The output stage circuit 4133 comprises a high side switch QH4, a high side diode structure DH4, a high side clamp circuit CLH4, a low side switch QL4 and a low side diode structure DL4. The high side switch QH4 can be, for example but not limited to, a P-type MOS field effect transistor (FET) as shown in FIG. 4. The high side switch QH4 is configured to operate according to a high side operation signal OPH3 received by a gate of the P-type MOSFET, to generate a high side output signal (in this embodiment, the high side output signal is illustrated by a drain voltage of the P-type MOSFET). The high side switch QH4 is electrically connected to an internal voltage VDD (in this embodiment, this is illustrated by that the source of the high side switch QH4 is electrically connected to the internal voltage VDD). The internal voltage VDD can be, for example but not limited to, 5V.

The high side diode structure DH4 is connected in series to the high side switch QH4. The high side diode structure DH4 is configured to operably transmit the high side output signal and to block a reverse bias voltage. As shown in FIG. 4, the high side diode structure DH4 can include, for example but not limited to, a high side PNP BJT having a base and a collector which are electrically connected to each other. The high side P-type region includes an emitter of the high side PNP BJT, whereas, the high side N-type region includes the base of the high side PNP BJT. As shown in FIG. 4, in the high side diode structure DH4, the dashed line PNP BJT illustrates a parasitic PNP BJT of the high side PNP BJT. A collector of the parasitic PNP BJT is the P-type semiconductor substrate and is electrically connected to the ground voltage level GND.

Note that in the above description that the high side diode structure DH4 is configured to operably block a reverse bias voltage, the term "reverse bias voltage" is with respect to the high side diode structure DH4.

As shown in FIG. 4, the low side diode structure DL4 is connected in series to the low side switch QL4. The low side diode structure DL4 is configured to operably transmit the low side output signal and to block a reverse bias voltage. The low side switch QL4 can be, for example but not limited to, an N-type MOSFET as shown in FIG. 4. The low side switch QL4 is configured to operate according to a low side operation signal OPL3 received by a gate the N-type MOSFET, to generate a low side output signal (in this embodiment, the low side output signal is illustrated by a source voltage of the N-type MOSFET). The low side switch QL4 is electrically connected to a reference voltage VSS (in this embodiment, this is illustrated by that the drain of the low side switch QL4 is electrically connected to the reference voltage VSS). The reference voltage VSS can be, for example but not limited to, 0V or ground voltage level GND.

As shown in FIG. 4, the low side diode structure DL4 is connected in series to the low side switch QL4. The low side diode structure DL4 is configured to operably transmit the low side output signal and to block a reverse bias voltage. In this embodiment, the low side diode structure DL4 includes a low side PNP BJT. In one embodiment, preferably, the low side PNP BJT has a concentric zone structure. The P-type emitter, the N-type base and the P-type collector of the low side PNP BJT are arranged from inside out successively. The low side PNP BJT further includes an isolation region and an N-type buried layer. The isolation region and the N-type buried layer have N-type conductivity. The isolation region and the N-type buried layer are located outside of the collector; the isolation region and the N-type buried layer are electrically connected to and encompass the collector. The isolation region and the N-type buried layer directly contact the P-type semiconductor substrate, to form the low side PN junction. The isolation region and the N-type buried layer directly contact the P-type semiconductor substrate and there is no insulating layer between the isolation region and the N-type buried layer and the P-type semiconductor substrate.

The base of the low side PNP BJT is electrically connected to the collector of the low side PNP BJT and the isolation region. The low side P-type region of the low side diode structure DL4 includes the emitter of the low side PNP BJT. The low side N-type region of the low side diode structure DL4 includes the base of the low side PNP BJT, the isolation region and the N-type buried layer. The low side P-type region which includes the emitter is electrically connected to the low side switch QL4, to receive the low side output signal. The low side N-type region is coupled to the low side output terminal CANL, to transmit the low side output signal to the low side output terminal CANL. Beneath a top surface of the P-type semiconductor substrate, the low side N-type region encompasses a lateral side and a bottom side of the low side P-type region, to form a low side PN junction. A low side substrate PN junction is formed between the low side N-type region and the P-type semiconductor substrate. The low side N-type region directly contacts the P-type semiconductor substrate and there is no insulating layer between the low side N-type region and the P-type semiconductor substrate. In one embodiment, the low side diode structure DL4 can be manufactured via a standard CMOS manufacturing process, which does not include a silicon on insulator (SOI) manufacturing process.

The low side diode structure DL4 has a structure which is the same as the low side diode structure DL3; for details, please refer to the low side diode structure DL3 shown in FIGS. 3D and 3E. Note that in the above description that the low side diode structure DL4 is configured to operably block a reverse bias voltage, the term "reverse bias voltage" is with respect to the low side diode structure DL4.

This embodiment is different from the second embodiment in that: the high side clamp circuit CLH4 of this embodiment further includes: a Zener diode ZD, a resistor RP, a capacitor CP, a voltage source VP and a diode DP. The Zener diode is coupled between the gate and the source of the P-type MOSFET of the high side clamp circuit CLH4. The Zener diode ZD is configured to keep a source-gate voltage (Vsg) of the P-type MOSFET to be at 5V, so as to ensure that the P-type MOSFET is turned ON. The resistor RP is connected in series to the Zener diode ZD. The resistor RP is configured to limit a current flowing through the Zener diode ZD under a situation where a voltage at the high side output terminal CANH is too high. For example, when a voltage at the high side output terminal CANH is 58V, the maximum current flowing through the Zener diode ZD can be represented as: (58−Vzd−Vp)/Rp, wherein Vzd denotes a breakdown voltage of the Zener diode ZD, Vp denotes a voltage supplied by the voltage source VP, and Rp denotes resistance of the resistor RP. The capacitor CP is coupled between the gate of the P-type MOSFET of the high side clamp circuit CLH4 and ground voltage level GND. The capacitor CP is configured to operably reduce the coupling effect caused by a gate-drain parasitic capacitor of the P-type MOSFET of the high side clamp circuit CLH4. The voltage source VP is connected in seires to the resistor RP. The voltage source VP is connected in seires to the resistor RP and the seris circuit is connected in parallel to the capacitor CP. The voltage source VP is configured to operably provide a predetermined bias voltage to the capacitor CP when the data transceiver controller circuit 41 transmits data via the high side output terminal CANH; the predetermined bias voltage for example can be a voltage higher than the ground voltage level GND. In the absence of the predetermined bias voltage being provided to the capacitor CP by the voltage source VP, when a gate is electrically connected to the ground voltage level GND, during a period where a voltage at the high side output terminal CANH decreases from a positive voltage to a negative voltage, the gate voltage will transit from ground voltage level GND to a negative voltage due to the coupling effect caused by the gate-drain parasitic capacitor of the P-type MOSFET of the high side clamp circuit CLH4. For this reason, the voltage source VP provides a predetermined bias voltage to the capacitor CP, so as to prevent the capacitor CP from transiting from ground voltage level GND to a negative voltage, thereby reducing the coupling effect caused by the gate-drain parasitic capacitor of the P-type MOSFET of the high side clamp circuit CLH4. The diode DP is connected in parallel to the capacitor CP. The diode DP is configured to operably provide a current recovery path when the gate voltage of the P-type MOSFET of the high side clamp circuit CLH4 is lower than a threshold voltage of the P-type MOSFET of the high side clamp circuit CLH4.

Figure 5:
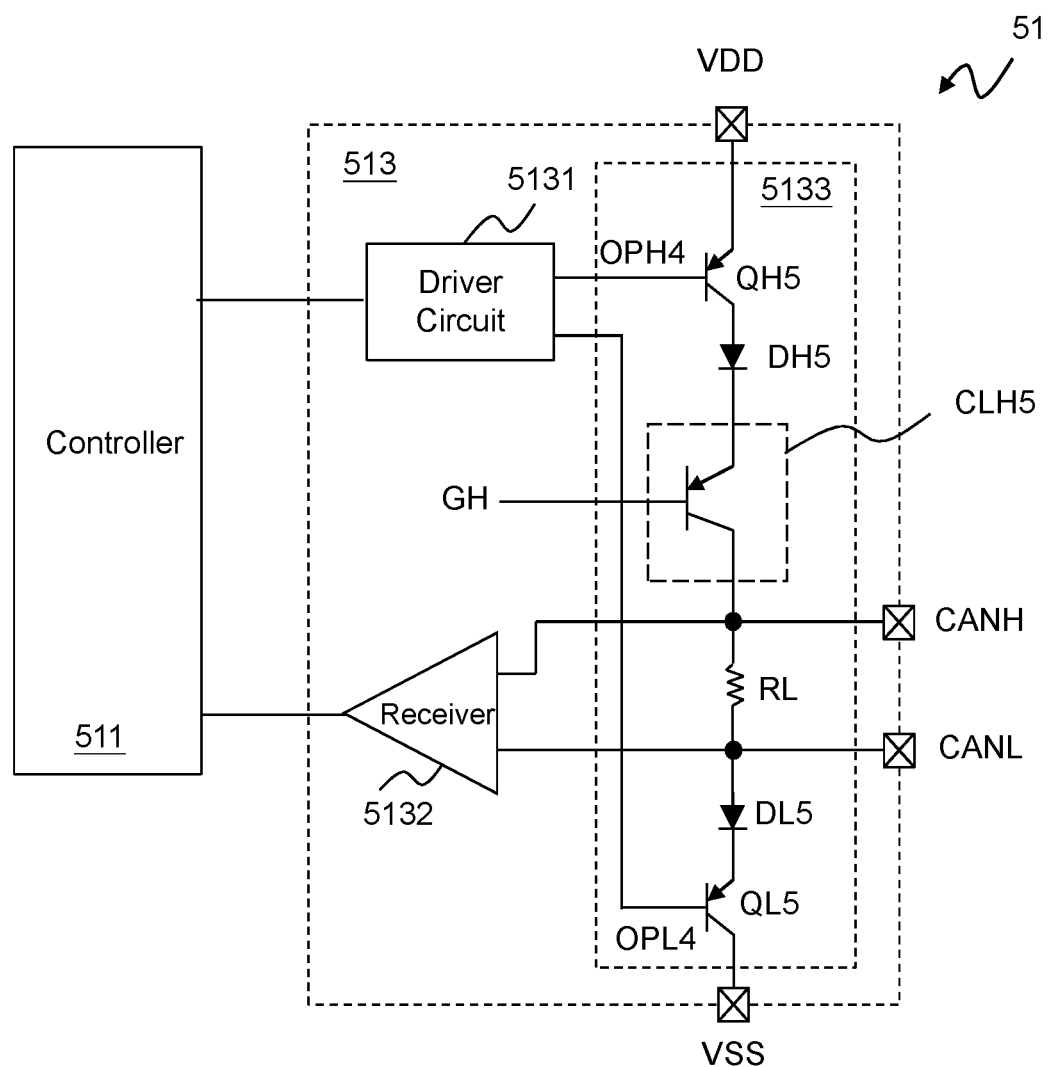
FIG. 5 shows a fourth embodiment of the present invention.

Please refer to FIG. 5, which shows a fourth embodiment of the present invention. FIG. 5 shows a schematic diagram of an output stage circuit 51 configured to operably transmit data via a bus. As shown in FIG. 5, the output stage circuit 51 comprises a controller 511 and a transceiver circuit 513. The controller 511 can control the transceiver circuit 513, such that the output stage circuit 51 can transmit or receive data via the bus (referring to the above-mentioned bus 12). On one hand, each data transceiver controller circuit 51 can generate a differential output signal between the corresponding high side output terminal CANH and the corresponding low side output terminal CANL, so as to transmit data. On the other hand, each data transceiver controller circuit 51 can receive a differential input signal via the corresponding high side output terminal CANH and the corresponding low side output terminal CANL, so as to receive data.

Please still refer to FIG. 5. In the data transceiver controller circuit 51, the transceiver circuit 513 includes a driver circuit 5131, a receiver 5132 and an output stage circuit 5133. Different data transceiver controller circuits 51 can transmit or receive data via the bus during different periods. As shown in FIG. 5, the controller 511 can control the driver circuit 5131 of the transceiver circuit 513, to operate a high side switch QH5 and a low side switch QL5 of the output stage circuit 5133, thus transmitting data via a corresponding output terminal CANH and a corresponding low side output terminal CANL. On the other hand, through the receiver 5132, each data transceiver controller circuit 51 can receive a differential input signal via the corresponding high side output terminal CANH and the corresponding low side output terminal CANL, so as to receive data.

Please still refer to FIG. 5. The output stage circuit 5133 configured to operably transmit data via a bus is formed on a P-type semiconductor substrate. The output stage circuit 5133 is configured to operably generate a differential output signal between a high side output terminal CANH and a low side output terminal CANL which are connected to the bus. The output stage circuit 5133 comprises a high side switch QH5, a high side diode structure DH5, a high side clamp circuit CLH5, a low side switch QL5 and a low side diode structure DL5. The high side switch QH5 can be, for example but not limited to, a PNP bipolar junction transistor (BJT) as shown in FIG. 5. The high side switch QH5 is configured to operate according to a high side operation signal OPH4, to generate a high side output signal (in this embodiment, the high side output signal is illustrated by a collector voltage of the PNP BJT). The high side switch QH5 is electrically connected to an internal voltage VDD (in this embodiment, this is illustrated by that the emitter of the high side switch QH5 is electrically connected to the internal voltage VDD). The internal voltage VDD can be, for example but not limited to, 5V.

The high side diode structure DH5 is connected in series to the high side switch QH5. The high side diode structure DH5 is configured to operably transmit the high side output signal and to block a reverse bias voltage. Note that in the above description that the high side diode structure DH5 is configured to operably block a reverse bias voltage, the term "reverse bias voltage" is with respect to the high side diode structure DH5.

This embodiment is different from the first embodiment in that: in this embodiment, as shown in FIG. 5, the high side clamp circuit CLH5 includes a PNP BJT having an emitter coupled to the high side N-type region of the high side diode structure DH5, a base which is biased to a predetermined control voltage GH, to prevent the voltage of the high side N-type region from being lower than the high side predetermined voltage, and a collector which is electrically connected to the high side output terminal CANH. The predetermined control voltage GH can be, for example but not limited to, 0V or ground voltage level GND.

The low side switch QL5 can be, for example but not limited to, a PNP BJT as shown in FIG. 5. The low side switch QL5 is configured to operate according to a low side operation signal OPL4, to generate a low side output signal (in this embodiment, the low side output signal is illustrated by an emitter voltage of the PNP BJT). The low side switch QL5 is electrically connected to a reference voltage VSS (in this embodiment, this is illustrated by that the collector of the low side switch QL5 is electrically connected to the reference voltage VSS). The reference voltage VSS can be, for example but not limited to, 0V or ground voltage level GND. The low side diode structure DL5 is connected in series to the low side switch QL5. The low side diode structure DL5 is configured to operably transmit the low side output signal and to block a reverse bias voltage. Note that in the above description that the low side diode structure DL5 is configured to operably block a reverse bias voltage, the term "reverse bias voltage" is with respect to the low side diode structure DL5.

Figure 6A:
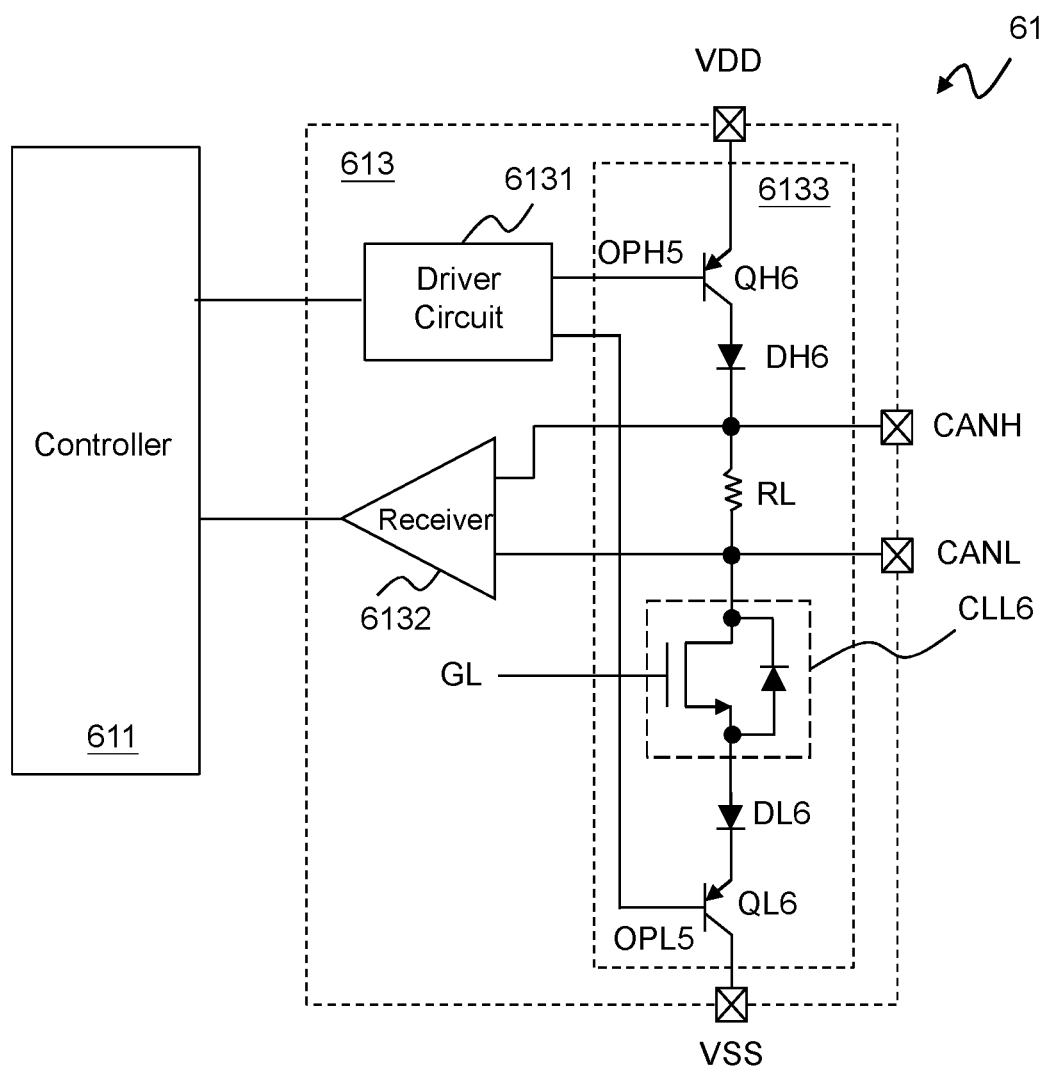
FIGS. 6A-6C show a fifth embodiment of the present invention.
Figure 6B:
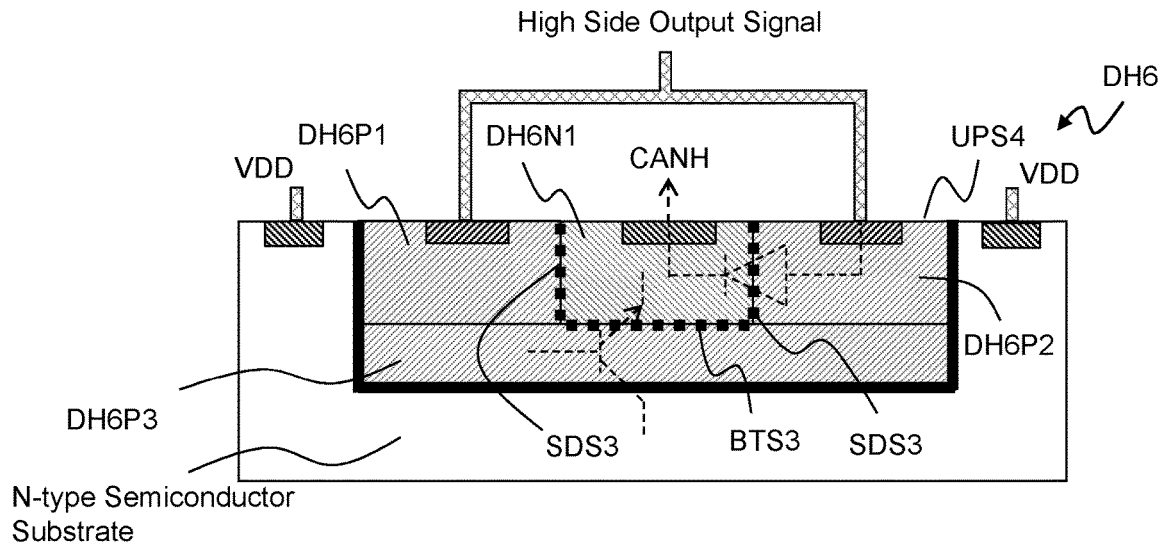
Figure 6C:
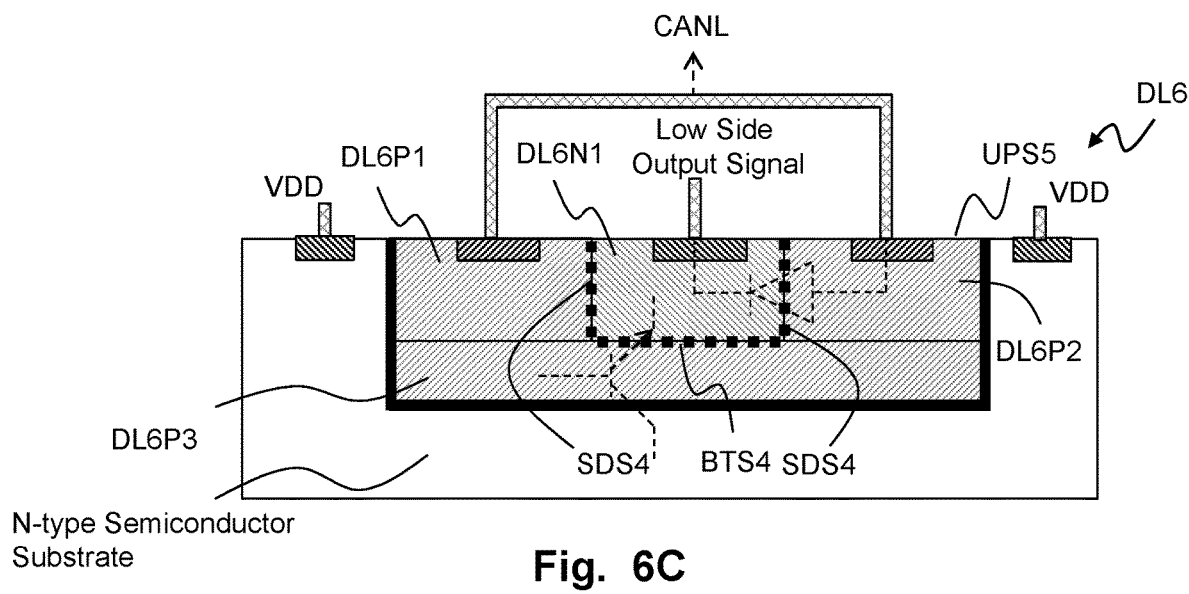

Please refer to FIGS. 6A-6C, which show a fifth embodiment of the present invention. FIG. 6A shows a schematic diagram of an output stage circuit 61 configured to operably transmit data via a bus. As shown in FIG. 6A, the output stage circuit 61 comprises a controller 611 and a transceiver circuit 613. The controller 611 can control the transceiver circuit 613, such that the output stage circuit 61 can transmit or receive data via the bus (referring to the above-mentioned bus 12). The bus has a high side signal line, a low side signal line and an impedance circuit coupled between the high side signal line and the low side signal line. For example, as shown in FIG. 1A, the impedance circuit can include, for example but not limited to, two resistors RL. Each resistor RL has its two ends electrically connected to the high side signal line and the low side signal line, respectively. The high side signal line has plural high side output terminals CANH, which are respectively coupled to the corresponding data transceiver controller circuits 61. The low side signal line has plural low side output terminals CANL, which are respectively coupled to the corresponding data transceiver controller circuits 61. On one hand, each data transceiver controller circuit 61 can generate a differential output signal between the corresponding high side output terminal CANH and the corresponding low side output terminal CANL, so as to transmit data. On the other hand, each data transceiver controller circuit 61 can receive a differential input signal via the corresponding high side output terminal CANH and the corresponding low side output terminal CANL, so as to receive data.

Please still refer to FIG. 6A. In the data transceiver controller circuit 61, the transceiver circuit 613 includes a driver circuit 6131, a receiver 6132 and an output stage circuit 6133. Different data transceiver controller circuits 61 can transmit or receive data via the bus during different periods. While one of the data transceiver controller circuits 61 is transmitting or receiving data, the rest of the data transceiver controller circuits 61 connected to the bus do not transmit or receive data via the bus. However, for the rest of the data transceiver controller circuits 61 that do not transmit or receive data via the bus, it is required for each output stage circuit 6133 of these data transceiver controller circuits 61 to withstand a voltage across the high side signal line and the low side signal line. For safety, the specification requires the output stage circuit 6133 to be able to withstand a voltage difference which is for example between +48V and −48V.

As shown in FIG. 6A, the controller 611 can control the driver circuit 6131 of the transceiver circuit 613, to operate a high side switch QH6 and a low side switch QL6 of the output stage circuit 6133, thus transmitting data via a corresponding output terminal CANH and a corresponding low side output terminal CANL. On the other hand, through the receiver 6132, each data transceiver controller circuit 61 can receive a differential input signal via the corresponding high side output terminal CANH and the corresponding low side output terminal CANL, so as to receive data.

Please still refer to FIG. 6A. The output stage circuit 6133 configured to operably transmit data via a bus is formed on an N-type semiconductor substrate. The output stage circuit 6133 is configured to operably generate a differential output signal between a high side output terminal CANH and a low side output terminal CANL which are connected to the bus. The output stage circuit 6133 comprises a high side switch QH6, a high side diode structure DH6, a low side clamp circuit CLL6, a low side switch QL6 and a low side diode structure DL6. The high side switch QH6 can be, for example but not limited to, a PNP bipolar junction transistor (BJT) as shown in FIG. 6A. The high side switch QH6 is configured to operate according to a high side operation signal OPH5, to generate a high side output signal (in this embodiment, the high side output signal is illustrated by a collector voltage of the PNP BJT). The high side switch QH6 is electrically connected to an internal voltage VDD (in this embodiment, this is illustrated by that the emitter of the high side switch QH6 is electrically connected to the internal voltage VDD). The internal voltage VDD can be, for example but not limited to, 5V.

The high side diode structure DH6 is connected in series to the high side switch QH6. The high side diode structure DH6 is configured to operably transmit the high side output signal and to block a reverse bias voltage. As shown in FIG. 6B, the high side diode structure DH6 has a high side P-type region and a high side N-type region DH6N1. The high side P-type region includes high side P-type sub-regions DH6P1, DH6P2 and DH6P3. The high side P-type sub-region DH6P3 can be, for example but not limited to, an N-type buried layer formed in a P-type semiconductor substrate; "buried layer" is well known to those skilled in the art, so the details thereof are not redundantly explained here. The high side P-type region is electrically connected to the high side switch QL6. The high side P-type region is configured to operably receive the high side output signal. The high side N-type region DH6N1 is coupled to the high side output terminal CANH. The high side N-type region DH6N1 is configured to operably transmit the high side output signal to the high side output terminal CANH. Beneath a top surface UPS4 of the N-type semiconductor substrate, the high side P-type region (which includes the high side P-type sub-regions DH6P1, DH6P2 and DH6P3) encompasses a lateral side SDS3 and a bottom side BTS3 of the high side N-type region DH6N1, to form a high side PN junction (as indicated by the black thick dotted line in FIG. 6B). And, a high side substrate PN junction (as indicated by the black thick solid line in FIG. 6B) is formed between the high side P-type region and the N-type semiconductor substrate. The N-type semiconductor substrate can be electrically connected to a highest voltage level of the circuit. For example, the N-type semiconductor substrate can be electrically connected to an internal voltage VDD shown in FIG. 6B. The high side P-type region directly contacts the N-type semiconductor substrate and there is no insulating layer between the high side P-type region and the N-type semiconductor substrate. In one embodiment, the high side diode structure DH6 can be manufactured via a standard CMOS manufacturing process, which does not include a silicon on insulator (SOI) manufacturing process.

Note that in the above description that the high side diode structure DH6 is configured to operably block a reverse bias voltage, the term "reverse bias voltage" is with respect to the high side diode structure DH6.

The low side switch QL6 can be, for example but not limited to, a PNP bipolar junction transistor (BJT) as shown in FIG. 6A. The low side switch QL6 is configured to operate according to a low side operation signal OPL5, to generate a low side output signal (in this embodiment, the low side output signal is illustrated by an emitter voltage of the PNP BJT). The low side switch QL6 is electrically connected to a reference voltage VSS (in this embodiment, this is illustrated by that the collector of the low side switch QL6 is electrically connected to the reference voltage VSS). The reference voltage VSS can be, for example but not limited to, 0V or ground voltage level GND.

As shown in FIG. 6A, the low side diode structure DL6 is connected in series to the low side switch QL6. The low side diode structure DL6 is configured to operably transmit the low side output signal and to block a reverse bias voltage. As shown in FIG. 6C, the low side diode structure DL6 has a low side N-type region DL6N1 and a low side P-type region. The low side P-type region includes low side P-type sub-regions DL6P1, DL6P2 and DL6P3. The low side P-type sub-region DL6P3 can be, for example but not limited to, a P-type buried layer formed in an N-type semiconductor substrate; "buried layer" is well known to those skilled in the art, so the details thereof are not redundantly explained here. The low side N-type region DL6N1 is electrically connected to the low side switch QL6. The low side N-type region DL6N1 is configured to operably receive the low side output signal. The low side P-type region is coupled to the low side output terminal CANL. The low side P-type region is configured to operably transmit the low side output signal to the low side output terminal CANL. And, beneath a top surface UPS5 of the N-type semiconductor substrate, the low side P-type region encompasses a lateral side SDS4 and a bottom side BTS4 of the low side N-type region DL6N1, to form a low side PN junction (as indicated by the black thick dotted line in FIG. 6C). And, a low side substrate PN junction (as indicated by the black thick solid line in FIG. 6C) is formed between the low side P-type region and the N-type semiconductor substrate. Each resistor RL of the impedance circuit of the bus is coupled between the high side output terminal CANH and the low side output terminal CANL. Each resistor RL of the impedance circuit of the bus is configured to operably generate a differential output signal according to the high side output signal and the low side output signal. The low side P-type region directly contacts the N-type semiconductor substrate and there is no insulating layer between the low side P-type region and the N-type semiconductor substrate. In one embodiment, the low side diode structure DL6 can be manufactured via a standard CMOS manufacturing process, which does not include a silicon on insulator (SOI) manufacturing process. The N-type semiconductor substrate can be electrically connected to a highest voltage level of the circuits. For example, the N-type semiconductor substrate can be electrically connected to an internal voltage VDD shown in FIG. 6C.

The voltage of the low side P-type region needs to be maintained not higher than a low side predetermined voltage, to prevent a parasitic NPN BJT (as indicated by the thin dashed line NPN BJT in FIG. 6C) from being turned ON under any situations. For example, a parasitic NPN BJT may be turned ON under a situation where a huge current flows through the low side diode structure DL6. For another example, a parasitic NPN BJT may be turned ON under a situation where a voltage at the low side output terminal CANL is a positive voltage. To elaborate in more detail, under a situation where a voltage at the low side output terminal CANL is a positive voltage, because a voltage of the base (i.e., the low side P-type sub-region DL6P3; e.g., 48V) of the parasitic NPN BJT will be higher than a voltage of the collector (i.e., the N-type semiconductor substrate; in this embodiment and other embodiments, the N-type semiconductor substrate can be electrically connected to a highest voltage level of the circuits, e.g., the internal voltage VDD shown in FIG. 6C), the parasitic NPN BJT will be turned ON. According to the present invention, the low side clamp circuit CLL6 is provided, which connected in series to the low side P-type region. The low side clamp circuit CLL6 is configured to operably clamp a voltage of the low side P-type region, to ensure the voltage of the low side P-type region not to be higher than a low side predetermined voltage, thereby preventing the parasitic NPN BJT formed between the low side diode structure DL6 and the N-type semiconductor substrate from being turned ON.

For example, as shown in FIG. 6A, the low side clamp circuit CLL6 includes an N-type MOS FET having a source coupled to the low side P-type region, a gate which is biased to a predetermined control voltage GL, to prevent the voltage of the low side P-type region from being higher than the low side predetermined voltage, and a drain which is electrically connected to the low side output terminal CANL. The predetermined control voltage GL can be, for example but not limited to, 2V or a positive voltage level. For example, when a gate-source voltage Vgs of the N-type MOSFET is lower than 1V, the N-type MOSFET is turned OFF. Accordingly, when the predetermined control voltage GL is 2V and when the voltage of the low side P-type region is not higher than the low side predetermined voltage (e.g., 1V), the N-type MOSFET remains turned ON. In contrast, when the voltage of the low side P-type region is higher than the low side predetermined voltage (e.g., 1V), the N-type MOSFET is turned OFF, thus preventing the voltage of the low side P-type region from being higher than the low side predetermined voltage (e.g., 1V). As thus, this embodiment can further protect the circuitry to avoid turning ON the parasitic PNP BJT. Note that in the above description that the low side diode structure DL6 is configured to operably block a reverse bias voltage, the term "reverse bias voltage" is with respect to the low side diode structure DL6.

Figure 7A:
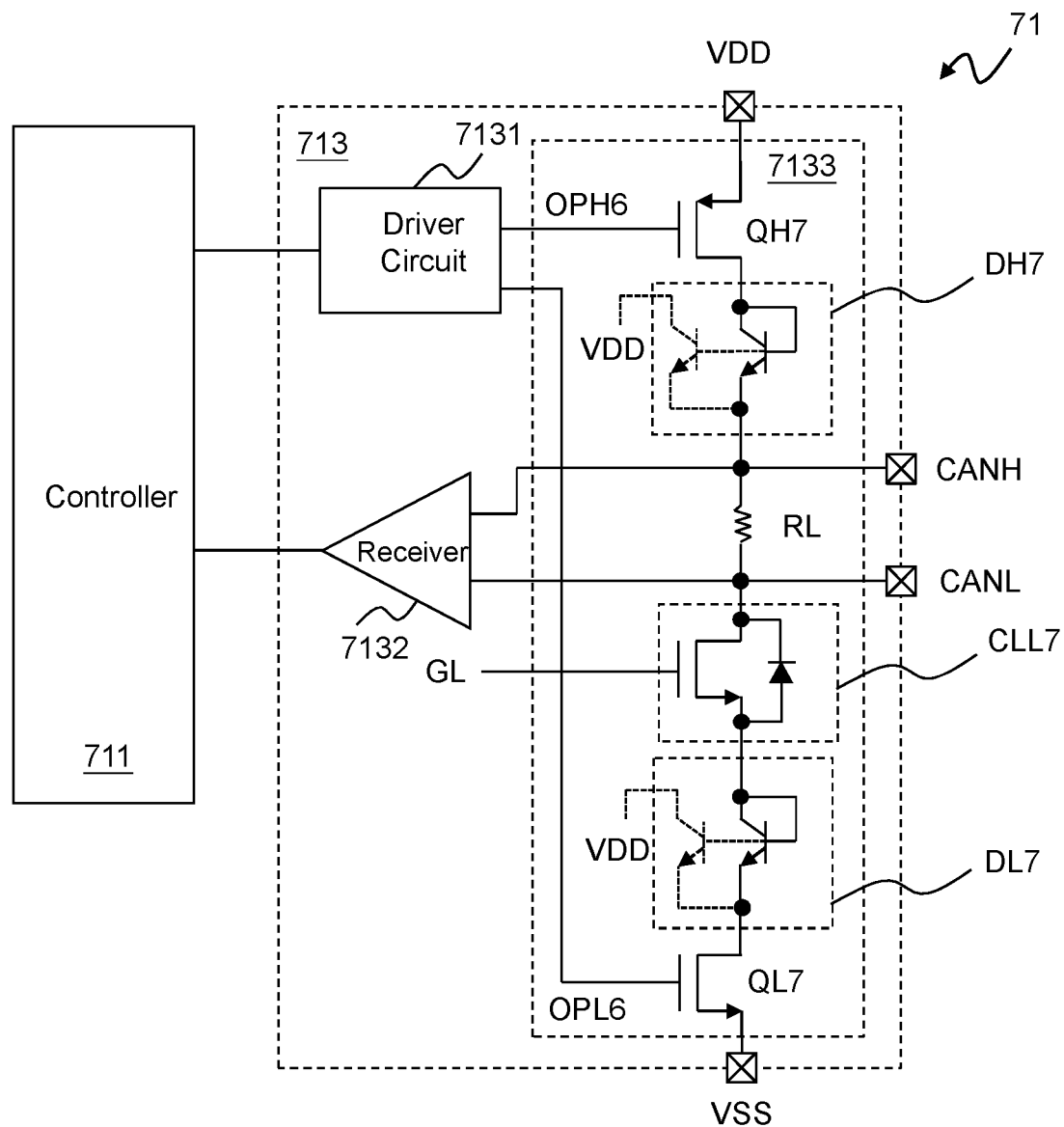
FIGS. 7A-7G show a sixth embodiment of the present invention.

Please refer to FIGS. 7A-7G, which show a sixth embodiment of the present invention. FIG. 7A shows a schematic diagram of an output stage circuit 71 configured to operably transmit data via a bus. As shown in FIG. 7A, the output stage circuit 71 comprises a controller 711 and a transceiver circuit 713. The controller 711 can control the transceiver circuit 713, such that the output stage circuit 71 can transmit or receive data via the bus (referring to the above-mentioned bus 12). The bus has a high side signal line, a low side signal line and an impedance circuit coupled between the high side signal line and the low side signal line. For example, as shown in FIG. 1A, the impedance circuit can include, for example but not limited to, two resistors RL. Each resistor RL has its two ends electrically connected to the high side signal line and the low side signal line, respectively. The high side signal line has plural high side output terminals CANH, which are respectively coupled to the corresponding data transceiver controller circuits 71. The low side signal line has plural low side output terminals CANL, which are respectively coupled to the corresponding data transceiver controller circuits 71. On one hand, each data transceiver controller circuit 71 can generate a differential output signal between the corresponding high side output terminal CANH and the corresponding low side output terminal CANL, so as to transmit data. On the other hand, each data transceiver controller circuit 71 can receive a differential input signal via the corresponding high side output terminal CANH and the corresponding low side output terminal CANL, so as to receive data.

Please still refer to FIG. 7A. In the data transceiver controller circuit 71, the transceiver circuit 713 includes a driver circuit 7131, a receiver 7132 and an output stage circuit 7133. Different data transceiver controller circuits 71 can transmit or receive data via the bus during different periods. While one of the data transceiver controller circuits 71 is transmitting or receiving data, the rest of the data transceiver controller circuits 71 connected to the bus do not transmit or receive data via the bus. However, for the rest of the data transceiver controller circuits 71 that do not transmit or receive data via the bus, it is required for each output stage circuit 7133 of each of these data transceiver controller circuits 71 to withstand a voltage across the high side signal line and the low side signal line. For safety, the specification requires the output stage circuit 7133 to be able to withstand a voltage difference which is for example between +48V and −48V.

As shown in FIG. 7A, the controller 711 can control the driver circuit 7131 of the transceiver circuit 713, to operate a high side switch QH7 and a low side switch QL7 of the output stage circuit 7133, thus transmitting data via a corresponding output terminal CANH and a corresponding low side output terminal CANL. On the other hand, through the receiver 7132, each data transceiver controller circuit 71 can receive a differential input signal via the corresponding high side output terminal CANH and the corresponding low side output terminal CANL, so as to receive data.

Please still refer to FIG. 7A. The output stage circuit 7133 configured to operably transmit data via a bus is formed on an N-type semiconductor substrate. The output stage circuit 7133 is configured to operably generate a differential output signal between a high side output terminal CANH and a low side output terminal CANL which are connected to the bus. The output stage circuit 7133 comprises a high side switch QH7, a high side diode structure DH7, a low side clamp circuit CLL7, a low side switch QL7 and a low side diode structure DL7. The high side switch QH7 can be, for example but not limited to, a P-type MOS field effect transistor (FET) as shown in FIG. 7A. The high side switch QH7 is configured to operate according to a high side operation signal OPH6 received by a gate of the P-type MOSFET, to generate a high side output signal (in this embodiment, the high side output signal is illustrated by a drain voltage of the P-type MOSFET). The high side switch QH7 is electrically connected to an internal voltage VDD (in this embodiment, this is illustrated by that the source of the high side switch QH7 is electrically connected to the internal voltage VDD). The internal voltage VDD can be, for example but not limited to, 5V.

The high side diode structure DH7 is connected in series to the high side switch QH7. The high side diode structure DH7 is configured to operably transmit the high side output signal and to block a reverse bias voltage. As shown in FIG. 7A, the high side diode structure DH7 can include, for example but not limited to, a high side NPN BJT having a base and a collector which are electrically connected to each other. The high side N-type region includes an emitter of the high side NPN BJT, whereas, the high side P-type region includes the base of the high side NPN BJT. As shown in FIG. 7A, in the high side diode structure DH7, the thin dashed line NPN BJT illustrates a parasitic NPN BJT of the high side NPN BJT. A collector of the parasitic NPN BJT is the N-type semiconductor substrate and is electrically connected to an internal voltage VDD.

Figure 7B:
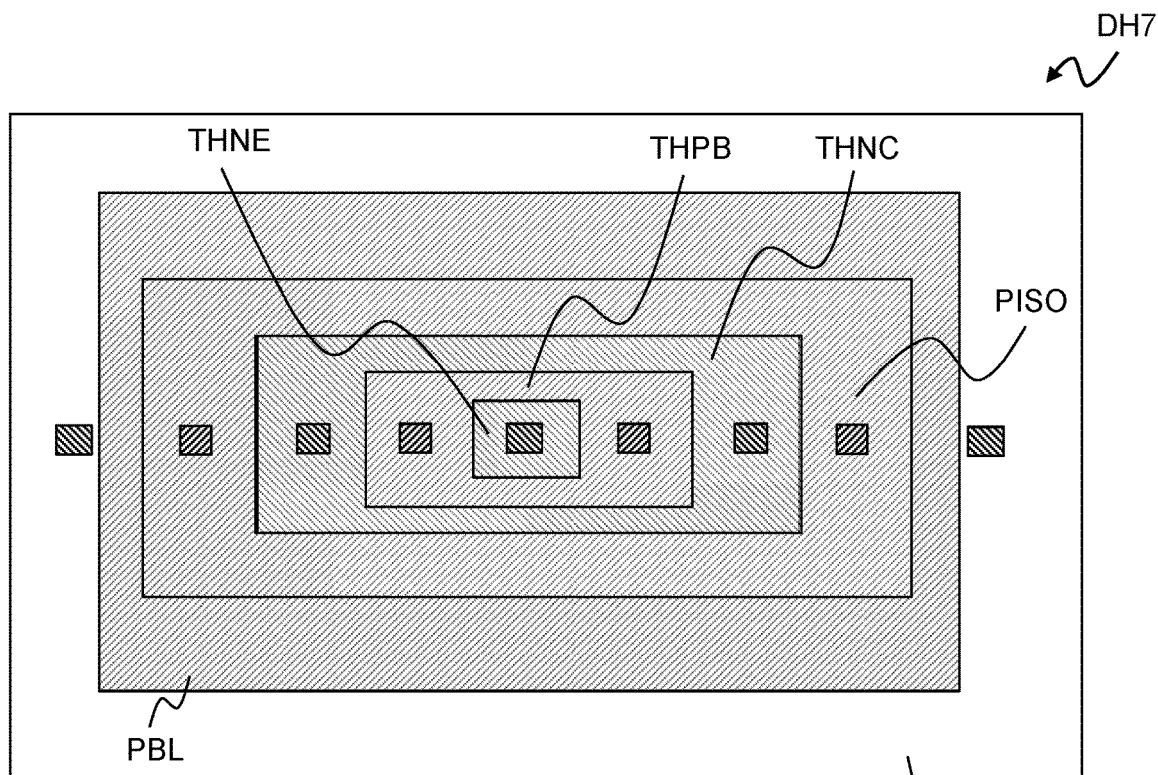
Figure 7C:
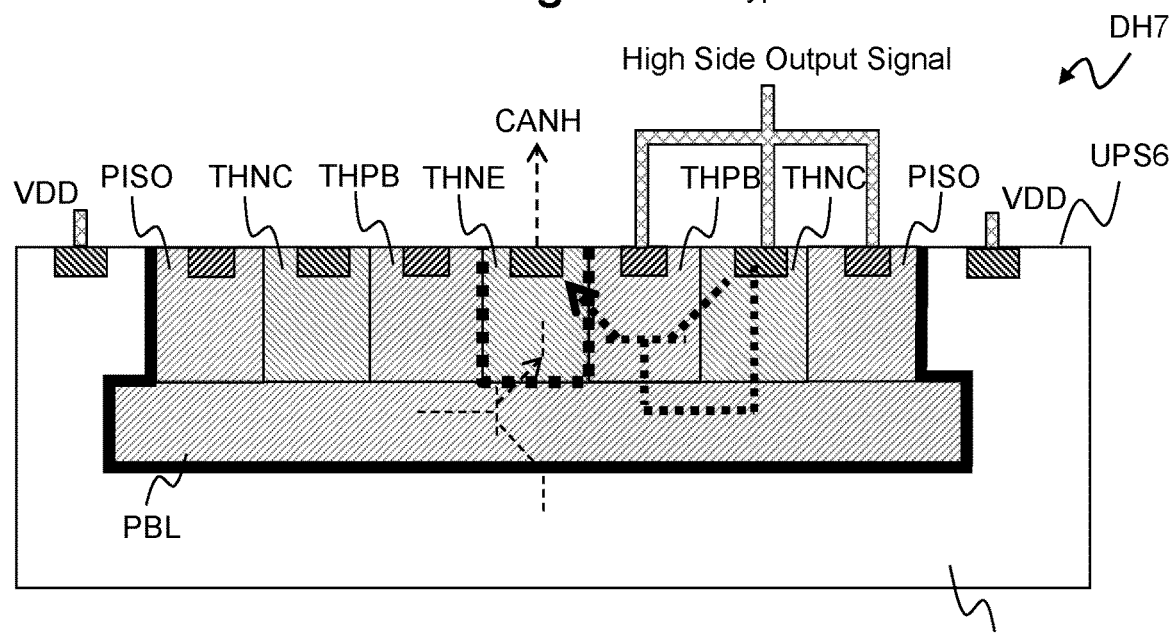

FIG. 7B shows a top view of a high side diode structure DH7, while FIG. 7C shows a cross-sectional view of a high side diode structure DH7. As shown in FIGS. 7B-7C, the high side diode structure DH7 includes a high side NPN BJT, as indicated by a transistor symbol of black thick dotted line in FIG. 7C. In one embodiment, preferably, as shown in FIG. 7B, the high side NPN BJT has a concentric zone structure. The N-type emitter THNE, the P-type base THPB and the N-type collector THNC of the high side NPN BJT are arranged from inside out successively. The high side NPN BJT further includes an isolation region PISO and a P-type buried layer PBL. The isolation region PISO and the P-type buried layer PBL have P-type conductivity. The isolation region PISO and the P-type buried layer PBL are located outside of the collector THNC; the isolation region PISO and the P-type buried layer PBL are electrically connected to and encompass the collector THNC. The isolation region PISO and the P-type buried layer PBL directly contact the N-type semiconductor substrate, to form the high side PN junction (as indicated by the black thick solid line in FIG. 7C). The isolation region PISO and the P-type buried layer PBL directly contact the N-type semiconductor substrate and there is no insulating layer between the isolation region PISO and the P-type buried layer PBL and the N-type semiconductor substrate.

As shown in FIG. 7C, the base THPB of the high side NPN BJT is electrically connected to the collector THNC of the high side NPN BJT and the isolation region PISO. The high side N-type region of the high side diode structure DH7 includes the emitter THNE of the high side NPN BJT. The high side P-type region of the high side diode structure DH7 includes the base THPB of the high side NPN BJT, the isolation region PISO and the P-type buried layer PBL. The high side P-type region is electrically connected to the high side switch QH7, to receive the high side output signal. The high side N-type region is coupled to the high side output terminal CANH, to transmit the high side output signal to the high side output terminal CANH. Beneath a top surface UPS6 of the N-type semiconductor substrate, the high side P-type region encompasses a lateral side and a bottom side of the high side N-type region, to form a high side PN junction (as indicated by the black thick solid line in FIG. 7C). A high side substrate PN junction is formed between the high side P-type region and the N-type semiconductor substrate. The high side P-type region directly contacts the N-type semiconductor substrate and there is no insulating layer between the high side P-type region and the N-type semiconductor substrate. In one embodiment, the high side diode structure DH7 can be manufactured via a standard CMOS manufacturing process, which does not include a silicon on insulator (SOI) manufacturing process. Note that in the description that the high side diode structure DH7 is configured to operably block a reverse bias voltage, the term "reverse bias voltage" is with respect to the high side diode structure DH7.

The low side switch QL7 can be, for example but not limited to, an N-type MOS field effect transistor (FET) as shown in FIG. 7A. The low side switch QL7 is configured to operate according to a low side operation signal OPL6 received by a gate of the N-type MOSFET, to generate a low side output signal (in this embodiment, the low side output signal is illustrated by a drain voltage of the N-type MOSFET). The low side switch QL7 is electrically connected to a reference voltage VSS (in this embodiment, this is illustrated by that the source of the low side switch QL7 is electrically connected to the reference voltage VSS). The reference voltage VSS can be, for example but not limited to, 0V or ground voltage level GND.

Figure 7D:
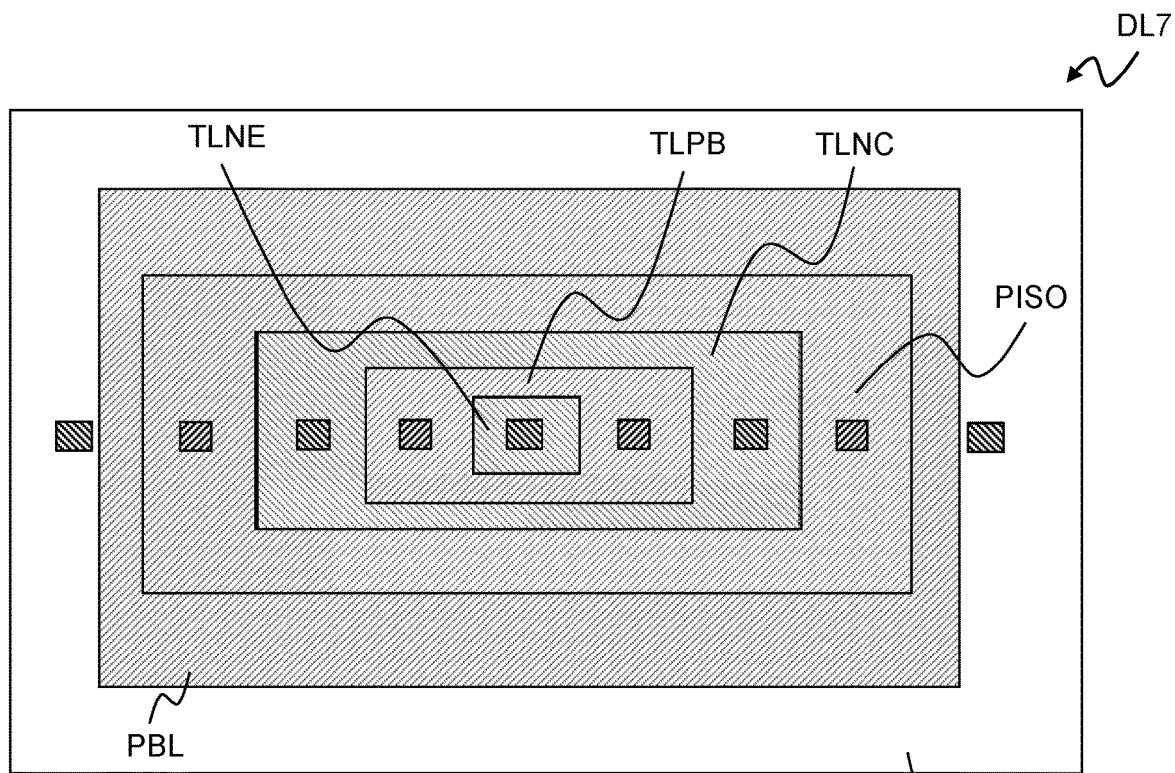
Figure 7E:
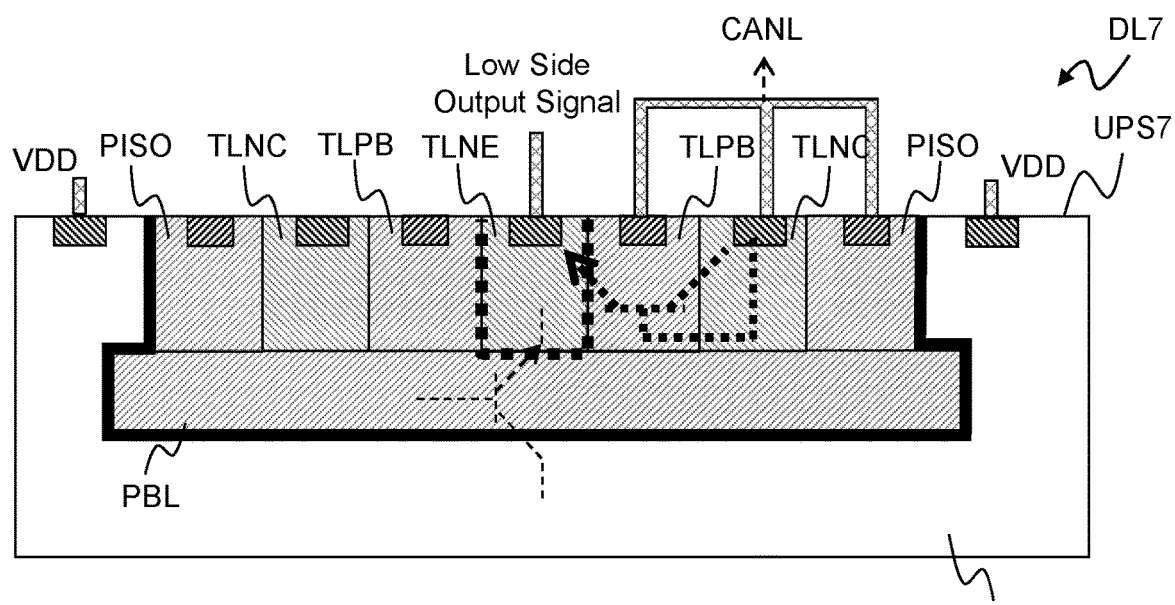

As shown in FIG. 7A, the low side diode structure DL7 is connected in series to the low side switch QL7. The low side diode structure DL7 is configured to operably transmit the low side output signal and to block a reverse bias voltage. FIG. 7D shows a top view of a low side diode structure DL7, while FIG. 7E shows a cross-sectional view of a low side diode structure DL7. As shown in FIGS. 7D-7E, the low side diode structure DL7 includes a low side NPN BJT, as indicated by a transistor symbol of black thick dotted line in FIG. 7E. In one embodiment, preferably, as shown in FIG. 7D, the low side NPN BJT has a concentric zone structure. The N-type emitter TLNE, the P-type base TLPB and the N-type collector TLNC of the low side NPN BJT are arranged from inside out successively. The low side NPN BJT further includes an isolation region PISO and a P-type buried layer PBL. The isolation region PISO and the P-type buried layer PBL have P-type conductivity. The isolation region PISO and the P-type buried layer PBL are located outside of the collector TLNC; the isolation region PISO and the P-type buried layer PBL are electrically connected to and encompass the collector TLNC. The isolation region PISO and the P-type buried layer PBL directly contact the N-type semiconductor substrate, to form the low side PN junction (as indicated by the black thick solid line in FIG. 7E). The isolation region PISO and the P-type buried layer PBL directly contact the N-type semiconductor substrate and there is no insulating layer between the isolation region PISO and the P-type buried layer PBL and the N-type semiconductor substrate.

As shown in FIG. 7E, the base TLPB of the low side NPN BJT is electrically connected to the collector TLNC of the low side NPN BJT and the isolation region PISO. The low side N-type region of the low side diode structure DL7 includes the emitter TLNE of the low side NPN BJT. The low side P-type region of the low side diode structure DL7 includes the base TLPB of the low side NPN BJT, the isolation region PISO and the P-type buried layer PBL. The low side N-type region which includes the emitter TLNE is electrically connected to the low side switch QL7, to receive the low side output signal. The low side P-type region is coupled to the low side output terminal CANL, to transmit the low side output signal to the low side output terminal CANL. Beneath a top surface UPS7 of the N-type semiconductor substrate, the low side P-type region encompasses a lateral side and a bottom side of the low side N-type region, to form a low side PN junction (as indicated by the black thick dotted line in FIG. 7E). A low side substrate PN junction (as indicated by the black thick solid line in FIG. 7E) is formed between the low side P-type region and the N-type semiconductor substrate. The low side P-type region directly contacts the N-type semiconductor substrate and there is no insulating layer between the low side P-type region and the N-type semiconductor substrate. In one embodiment, the low side diode structure DL7 can be manufactured via a standard CMOS manufacturing process, which does not include a silicon on insulator (SOI) manufacturing process. The N-type semiconductor substrate can be electrically connected to a highest voltage level of the circuit. For example, the N-type semiconductor substrate can be electrically connected to an internal voltage VDD shown in FIG. 7A and FIG. 7C.

The voltage of the low side P-type region needs to be maintained not higher than a low side predetermined voltage, to prevent a parasitic NPN BJT (as indicated by the thin dashed line NPN BJT in FIG. 7E) from being turned ON under any situations. For example, a parasitic NPN BJT may be turned ON under a situation where a huge current flows through the low side diode structure DL7. For another example, a parasitic NPN BJT may be turned ON under a situation where a voltage at the low side output terminal CANL is a positive voltage. To elaborate in more detail, under a situation where a voltage at the low side output terminal CANL is a positive voltage, because a voltage of the base (i.e., the P-type buried layer PBL; e.g., 48V) of the parasitic NPN BJT will be higher than a voltage of the collector (i.e., the N-type semiconductor substrate; in this embodiment and other embodiments, the N-type semiconductor substrate can be electrically connected to a highest voltage level of the circuits, e.g., the internal voltage VDD shown in FIG. 7E), the parasitic NPN BJT will be turned ON. According to the present invention, the low side clamp circuit CLL7 is provided, which connected in series to the low side P-type region. The low side clamp circuit CLL7 is configured to operably clamp a voltage of the low side P-type region, to ensure the voltage of the low side P-type region not to be higher than a low side predetermined voltage, thereby preventing the parasitic NPN BJT formed between the low side diode structure DL7 and the N-type semiconductor substrate from being turned ON.

For example, as shown in FIG. 7A, the low side clamp circuit CLL7 includes an N-type MOS FET having a source coupled to the low side P-type region, a gate which is biased to a predetermined control voltage GL, to prevent the voltage of the low side P-type region from being higher than the low side predetermined voltage, and a drain which is electrically connected to the low side output terminal CANL. The predetermined control voltage GL can be, for example but not limited to, 2V or a positive voltage level.

For example, when a gate-source voltage Vgs of the N-type MOSFET is lower than 1V, the N-type MOSFET is turned OFF. Accordingly, when the predetermined control voltage GL is 2V and when the voltage of the low side P-type region is not higher than the low side predetermined voltage (e.g., 1V), the N-type MOSFET remains turned ON. In contrast, when the voltage of the low side P-type region is higher than the low side predetermined voltage (e.g., 1V), the N-type MOSFET is turned OFF, thus preventing the voltage of the low side P-type region from being higher than the low side predetermined voltage (e.g., 1V). As thus, this embodiment can further protect the circuitry to avoid turning ON the parasitic PNP BJT. Note that in the above description that the low side diode structure DL7 is configured to operably block a reverse bias voltage, the term "reverse bias voltage" is with respect to the low side diode structure DL7.

Figure 7F:
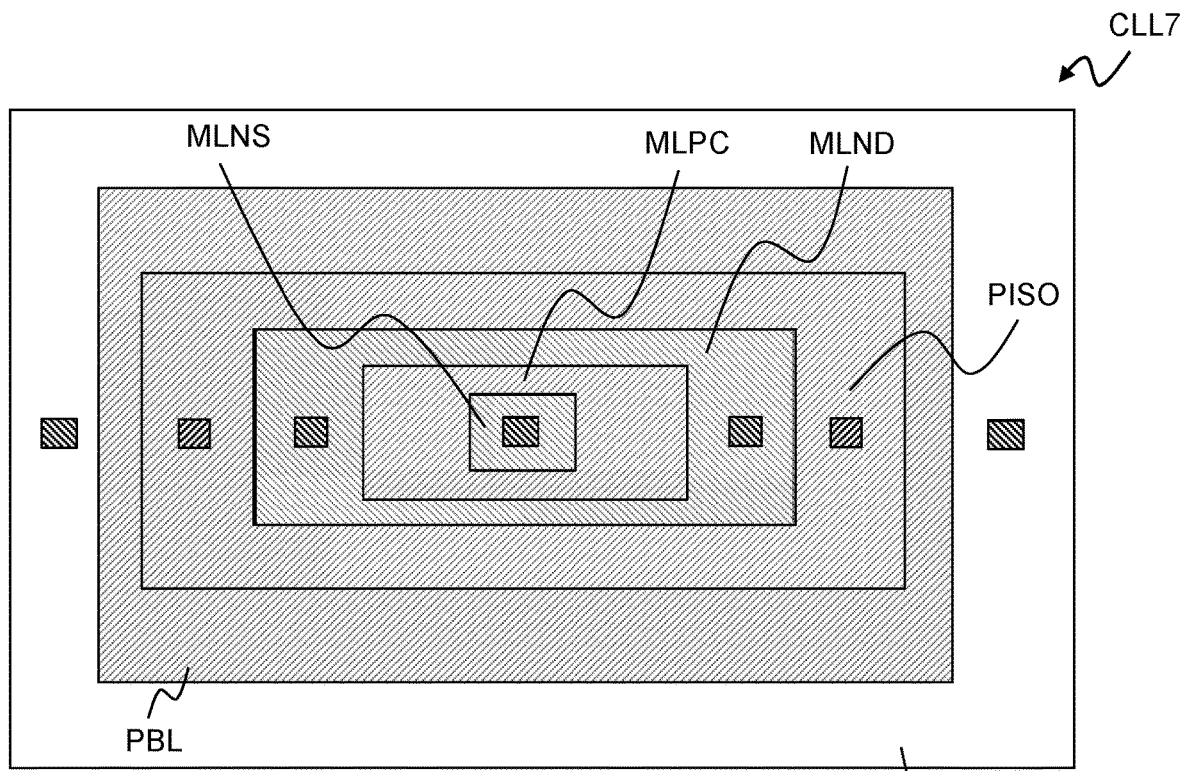
Figure 7G:
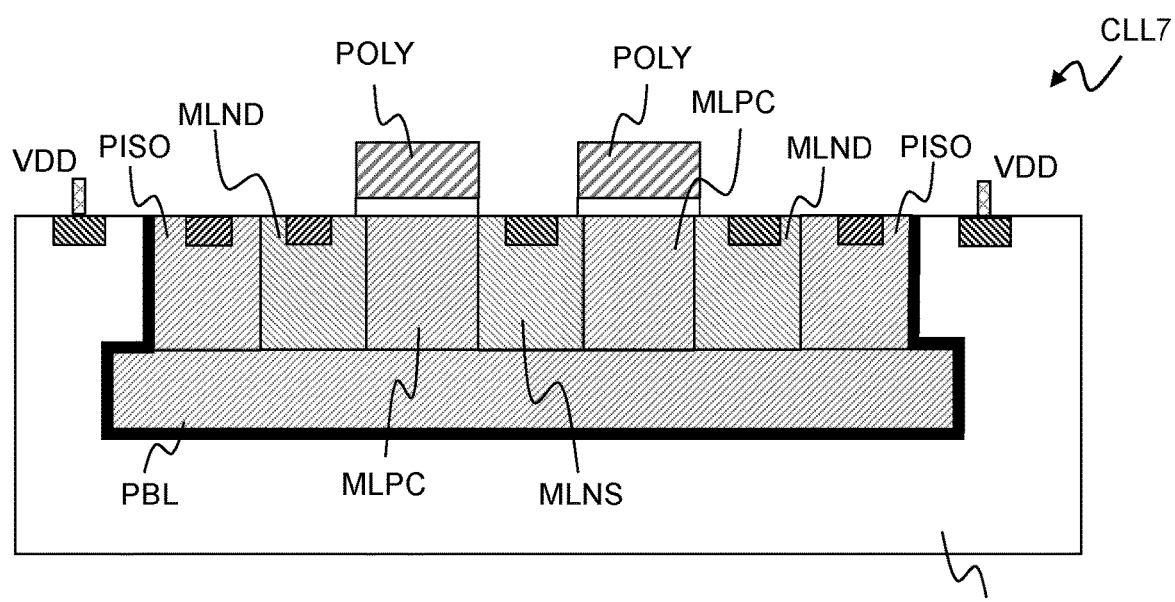

FIG. 7F shows a top view of a low side clamp circuit CLL7, while FIG. 7G shows a cross-sectional view of a low side clamp circuit CLL7. As shown in FIGS. 7F-7G, the low side clamp circuit CLL7 includes an N-type MOSFET having a gate POLY. In one embodiment, preferably, as shown in FIG. 7F, the low side clamp circuit CLL7 has a concentric zone structure. The N-type source MLNS, the P-type channel MLPC and the N-type drain MLND of the low side clamp circuit CLL7 are arranged from inside out successively. The low side clamp circuit CLL7 further includes an isolation region PISO and a P-type buried layer PBL. The isolation region PISO and a P-type buried layer PBL have P-type conductivity. The isolation region PISO and a P-type buried layer PBL are located outside of the N-type drain MLND; the isolation region PISO and the P-type buried layer PBL are electrically connected to and encompass the N-type drain MLND. The isolation region PISO and a P-type buried layer PBL directly contact the N-type semiconductor substrate, to form the high side PN junction (as indicated by the black thick solid line in FIG. 7G). The isolation region PISO and the P-type buried layer PBL directly contact the N-type semiconductor substrate and there is no insulating layer between the isolation region PISO and a P-type buried layer PBL and the N-type semiconductor substrate. In one embodiment, the low side clamp circuit CLL7 can be manufactured via a standard CMOS manufacturing process, which does not include a silicon on insulator (SOI) manufacturing process. The N-type semiconductor substrate can be electrically connected to a highest voltage level of the circuit. For example, the N-type semiconductor substrate can be electrically connected to an internal voltage VDD shown in FIG. 7G.

Figure 8:
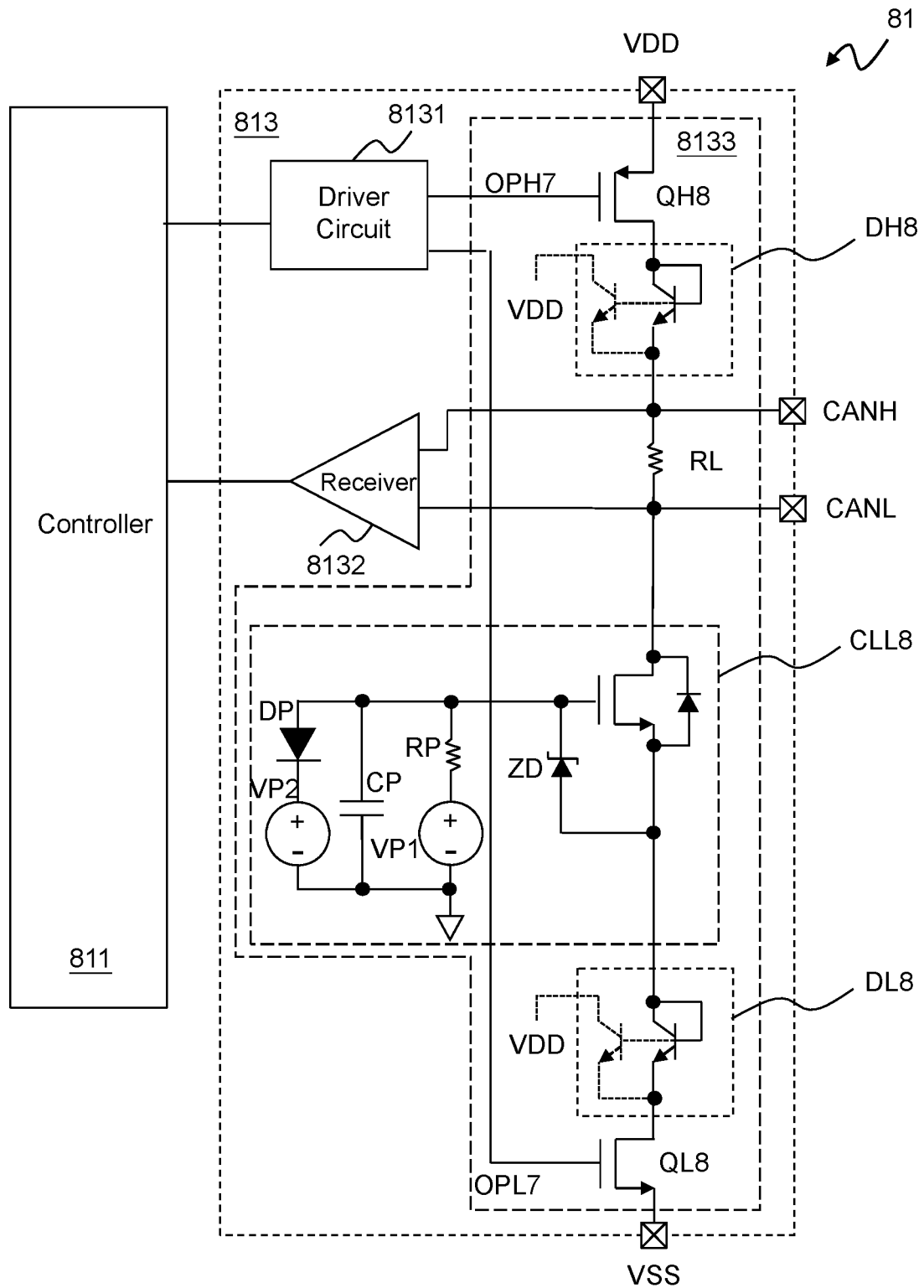
FIG. 8 shows a seventh embodiment of the present invention.

Please refer to FIG. 8, which shows a seventh embodiment of the present invention. FIG. 8 shows a schematic diagram of an output stage circuit 81 configured to operably transmit data via a bus. As shown in FIG. 8, the output stage circuit 81 comprises a controller 811 and a transceiver circuit 813. The controller 811 can control the transceiver circuit 813, such that the output stage circuit 81 can transmit or receive data via the bus (referring to the above-mentioned bus 12). On one hand, each data transceiver controller circuit 81 can generate a differential output signal between the corresponding high side output terminal CANH and the corresponding low side output terminal CANL, so as to transmit data. On the other hand, each data transceiver controller circuit 81 can receive a differential input signal via the corresponding high side output terminal CANH and the corresponding low side output terminal CANL, so as to receive data.

Please still refer to FIG. 8. In the data transceiver controller circuit 81, the transceiver circuit 813 includes a driver circuit 8131, a receiver 8132 and an output stage circuit 8133. As shown in FIG. 8, the controller 811 can control the driver circuit 8131 of the transceiver circuit 813, to operate a high side switch QH8 and a low side switch QL8 of the output stage circuit 8133, thus transmitting data via a corresponding output terminal CANH and a corresponding low side output terminal CANL. On the other hand, through the receiver 8132, each data transceiver controller circuit 81 can receive a differential input signal via the corresponding high side output terminal CANH and the corresponding low side output terminal CANL, so as to receive data.

Please still refer to FIG. 8. The output stage circuit 8133 configured to operably transmit data via a bus is formed on an N-type semiconductor substrate. The output stage circuit 8133 is configured to operably generate a differential output signal between a high side output terminal CANH and a low side output terminal CANL which are connected to the bus. The output stage circuit 8133 comprises a high side switch QH8, a high side diode structure DH8, a low side clamp circuit CLL8, a low side switch QL8 and a low side diode structure DL8. The high side switch QH8 can be, for example but not limited to, a P-type MOS field effect transistor (FET) as shown in FIG. 8. The high side switch QH8 is configured to operate according to a high side operation signal OPH7 received by a gate of the P-type MOSFET, to generate a high side output signal (in this embodiment, the high side output signal is illustrated by a drain voltage of the P-type MOSFET). The high side switch QH8 is electrically connected to an internal voltage VDD (in this embodiment, this is illustrated by that the source of the high side switch QH8 electrically connected to the internal voltage VDD). The internal voltage VDD can be, for example but not limited to, 5V.

The high side diode structure DH8 is connected in series to the high side switch QH8. The high side diode structure DH8 is configured to operably transmit the high side output signal and to block a reverse bias voltage. As shown in FIG. 8, the high side diode structure DH8 can include, for example but not limited to, a high side NPN BJT having a base and a collector which are electrically connected to each other. The high side N-type region includes an emitter of the high side NPN BJT, whereas, the high side P-type region includes the base of the high side NPN BJT. As shown in FIG. 8, in the high side diode structure DH8, the thin dashed line NPN BJT illustrates a parasitic NPN BJT of the high side NPN BJT. A collector of the parasitic NPN BJT is the N-type semiconductor substrate and is electrically connected to a highest voltage level of the internal circuits, for example but not limited to an internal voltage VDD shown in FIG. 8.

Note that in the above description that the high side diode structure DH8 is configured to operably block a reverse bias voltage, the term "reverse bias voltage" is with respect to the high side diode structure DH8.

The low side switch QL8 can be, for example but not limited to, an N-type MOS field effect transistor (FET) as shown in FIG. 8. The low side switch QL8 is configured to operate according to a low side operation signal OPL7 received by a gate of the N-type MOSFET, to generate a low side output signal (in this embodiment, the low side output signal is illustrated by a drain voltage of the N-type MOSFET). The low side switch QL8 is electrically connected to a reference voltage VSS (in this embodiment, this is illustrated by that the source of the low side switch QL8 is electrically connected to the reference voltage VSS). The reference voltage VSS can be, for example but not limited to, 0V or ground voltage level GND.

As shown in FIG. 8, the low side diode structure DL8 is connected in series to the low side switch QL8. The low side diode structure DL8 is configured to operably transmit the low side output signal and to block a reverse bias voltage. In this embodiment, the low side diode structure DL8 further includes a low side NPN BJT. In one embodiment, preferably, the low side NPN BJT has a concentric zone structure. The N-type emitter, the P-type base and the N-type collector of the low side NPN BJT are arranged from inside out successively. The low side NPN BJT further includes an isolation region and a P-type buried layer. The isolation region and the P-type buried layer have P-type conductivity. The isolation region and the P-type buried layer are located outside of the collector; the isolation region and the P-type buried layer are electrically connected to and encompass the collector. The isolation region and the P-type buried layer directly contact the N-type semiconductor substrate, to form the low side PN junction. The isolation region and the P-type buried layer directly contact the N-type semiconductor substrate and there is no insulating layer between the isolation region and the P-type buried layer and the N-type semiconductor substrate. The N-type semiconductor substrate can be electrically connected to a highest voltage level of the circuit. For example, a collector voltage of a parasitic NPN BJT (as indicated by the dashed line NPN BJT in FIG. 8) is electrically connected to an internal voltage VDD.

The base of the low side NPN BJT is electrically connected to the collector of the low side NPN BJT and the isolation region. The low side N-type region of the low side diode structure DL8 includes the emitter of the low side NPN BJT. The low side P-type region of the low side diode structure DL8 includes the base of the low side NPN BJT, the isolation region and the P-type buried layer. The low side N-type region which includes the emitter is electrically connected to the low side switch QL8, to receive the low side output signal. The low side P-type region is coupled to the low side output terminal CANL, to transmit the low side output signal to the low side output terminal CANL. Beneath a top surface of the N-type semiconductor substrate, the low side P-type region encompasses a lateral side and a bottom side of the low side N-type region, to form a low side PN junction. A low side substrate PN junction is formed between the low side P-type region and the N-type semiconductor substrate. The low side P-type region directly contacts the N-type semiconductor substrate and there is no insulating layer between the low side P-type region and the N-type semiconductor substrate. In one embodiment, the low side diode structure DL8 can be manufactured via a standard CMOS manufacturing process, which does not include a silicon on insulator (SOI) manufacturing process.

This embodiment is different from the sixth embodiment in that: the low side clamp circuit CLL8 of this embodiment further includes: a Zener diode ZD, a resistor RP, a capacitor CP, a voltage source VP1 and a diode DP connected in series to a voltage source VP2. The Zener diode is coupled between the gate and the source of the N-type MOSFET of the low side clamp circuit CLL8. The Zener diode ZD is configured to keep a gate-source voltage (Vgs) of the N-type MOSFET to be at 5V, so as to ensure that the P-type MOSFET is turned ON. The resistor RP is connected in series to the voltage source VP1. The resistor RP is configured to operably limit a current flowing through the Zener diode ZD when a voltage at the low side output terminal CANL is too low. The capacitor CP is coupled between the gate of the N-type MOSFET of the low side clamp circuit CLL8 and the voltage source VP2. The capacitor CP is configured to operably reduce the coupling effect caused by a gate-drain parasitic capacitor of the N-type MOSFET of the low side clamp circuit CLL8. The voltage source VP1 is connected in seires to the resistor RP, and the series circuit of the voltage source VP1 and the resistor RP is connected in parallel to the capacitor CP. The voltage source VP1 is configured to operably provide a predetermined bias voltage to the capacitor CP when the data transceiver controller circuit 81 transmits data via the low side output terminal CANL, thereby reducing the coupling effect caused by the gate-drain parasitic capacitor of the N-type MOSFET of the low side clamp circuit CLL8. The diode DP is connected in seires to the voltage source VP2, and the series circuit of the diode DP and the voltage source VP2 is connected in parallel to the capacitor CP. The diode DP connected in seires to the voltage source VP2 is configured to operably provide a quick clamping path for controlling the gate of the N-type MOSFET of the low side clamp circuit CLL8, to reduce the coupling effect caused by the gate-drain parasitic capacitor of the N-type MOSFET of the low side clamp circuit CLL8. The voltage supplied by the voltage source VP2 is higher than the voltage supplied by the voltage source VP1.

Figure 9:
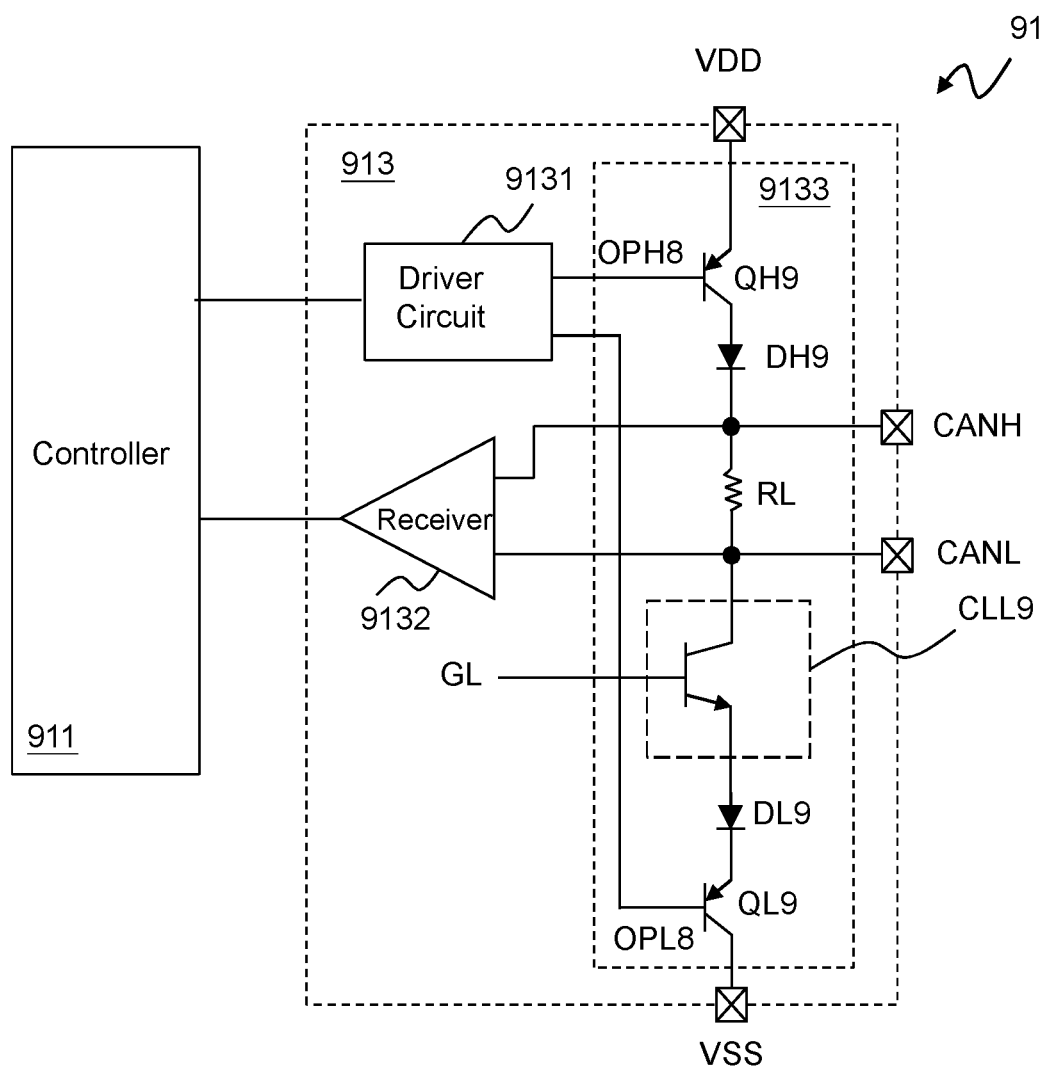
FIG. 9 shows an eighth embodiment of the present invention.

Please refer to FIG. 9, which shows an eighth embodiment of the present invention. FIG. 9 shows a schematic diagram of an output stage circuit 91 configured to operably transmit data via a bus. As shown in FIG. 9, the output stage circuit 91 comprises a controller 911 and a transceiver circuit 913. The controller 911 can control the transceiver circuit 913, such that the output stage circuit 91 can transmit or receive data via the bus (referring to the above-mentioned bus 12). On one hand, each data transceiver controller circuit 91 can generate a differential output signal between the corresponding high side output terminal CANH and the corresponding low side output terminal CANL, so as to transmit data. On the other hand, each data transceiver controller circuit 91 can receive a differential input signal via the corresponding high side output terminal CANH and the corresponding low side output terminal CANL, so as to receive data.

Please still refer to FIG. 9. In the data transceiver controller circuit 91, the transceiver circuit 913 includes a driver circuit 9131, a receiver 9132 and an output stage circuit 9133. Different data transceiver controller circuits 91 can transmit or receive data via the bus during different periods. As shown in FIG. 9, the controller 911 can control the driver circuit 9131 of the transceiver circuit 913, to operate a high side switch QH9 and a low side switch QL9 of the output stage circuit 9133, thus transmitting data via a corresponding output terminal CANH and a corresponding low side output terminal CANL. On the other hand, through the receiver 9132, each data transceiver controller circuit 91 can receive a differential input signal via the corresponding high side output terminal CANH and the corresponding low side output terminal CANL, so as to receive data.

Please still refer to FIG. 9. The output stage circuit 9133 configured to operably transmit data via a bus is formed on an N-type semiconductor substrate. The output stage circuit 9133 is configured to operably generate a differential output signal between a high side output terminal CANH and a low side output terminal CANL which are connected to the bus. The output stage circuit 9133 comprises a high side switch QH9, a high side diode structure DH9, a low side clamp circuit CLL9, a low side switch QL9 and a low side diode structure DL9. The high side switch QH9 can be, for example but not limited to, a PNP bipolar junction transistor (BJT) as shown in FIG. 9. The high side switch QH9 is configured to operate according to a high side operation signal OPH8, to generate a high side output signal (in this embodiment, the high side output signal is illustrated by a colleter voltage of the PNP BJT). The high side switch QH9 is electrically connected to an internal voltage VDD (in this embodiment, this is illustrated by that the emitter of the high side switch QH9 is electrically connected to the internal voltage VDD). The internal voltage VDD can be, for example but not limited to, 5V.

The high side diode structure DH9 is connected in series to the high side switch QH9. The high side diode structure DH9 is configured to operably transmit the high side output signal and to block a reverse bias voltage. Note that in the above description that the high side diode structure DH9 is configured to operably block a reverse bias voltage, the term "reverse bias voltage" is with respect to the high side diode structure DH9.

This embodiment is different from the fifth embodiment in that: in this embodiment, as shown in FIG. 9, the low side clamp circuit CLL9 includes a NPN BJT having an emitter coupled to the low side P-type region of the low side diode structure DL9, a base which is biased to a predetermined control voltage GL, to prevent the voltage of the low side P-type region from being higher than the low side predetermined voltage, and a collector which of the NPN BJT is electrically connected to the low side output terminal CANL. The predetermined control voltage GL can be, for example but not limited to, 2V or a positive voltage level.

The low side switch QL9 can be, for example but not limited to, a PNP bipolar junction transistor (BJT) as shown in FIG. 9. The low side switch QL9 is configured to operate according to a low side operation signal OPL8, to generate a low side output signal (in this embodiment, the low side output signal is illustrated by an emitter voltage of the PNP BJT). The low side switch QL9 is electrically connected to a reference voltage VSS (in this embodiment, this is illustrated by that the collector of the low side switch QL9 is electrically connected to the reference voltage VSS). The reference voltage VSS can be, for example but not limited to, 0V or ground voltage level GND. The low side diode structure DL9 is connected in series to the low side switch QL9. The low side diode structure DL9 is configured to operably transmit the low side output signal and to block a reverse bias voltage. Note that the term "reverse bias voltage" as described above is with respect to the low side diode structure DL9.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, the logic circuit described in the above-mentioned embodiments is not limited to the NOT logic gate and NAND logic gate shown, it can be replaced by any other logic gates as long as a same logic computation result can be obtained. For another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. For yet another example, a manufacture process or a structure which does not substantially influence the primary function of a device can be inserted between any two devices in the shown embodiments, such as a threshold voltage adjustment region. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. An output stage circuit configured to operably transmit data via a bus, the output stage circuit being formed on a P-type semiconductor substrate, wherein the output stage circuit is configured to operably generate a differential output signal between a high side output terminal and a low side output terminal which are connected to the bus; the output stage circuit comprising:

a high side switch, which is configured to operate according to a high side operation signal, to generate a high side output signal, wherein the high side switch is electrically connected to an internal voltage;

a high side diode structure connected in series to the high side switch, the high side diode structure being configured to operably transmit the high side output signal and to block a reverse bias voltage, wherein the high side diode structure includes:

a high side P-type region, which is electrically connected to the high side switch, the high side P-type region being configured to operably receive the high side output signal; and a high side N-type region, which is coupled to the high side output terminal, the high side N-type region being configured to operably transmit the high side output signal, wherein beneath a top surface of the P-type semiconductor substrate, the high side N-type region encompasses a lateral side and a bottom side of the high side P-type region, to form a high side PN junction, wherein a high side substrate PN junction is formed between the high side N-type region and the P-type semiconductor substrate;

a high side clamp circuit, which is connected in series to the high side N-type region, the high side clamp circuit being configured to operably clamp a voltage of the high side N-type region, to ensure the voltage of the high side N-type region not to be lower than a high side predetermined voltage, thereby preventing a parasitic PNP bipolar junction transistor formed between the high side diode structure and the P-type semiconductor substrate from being turned ON;

a low side switch, which is configured to operate according to a low side operation signal, to generate a low side output signal, wherein the low side switch is electrically connected to a reference voltage; and a low side diode structure connected in series to the low side switch, the low side diode structure being configured to operably transmit the low side output signal and to block a reverse bias voltage, wherein the low side diode structure includes:

a low side P-type region, which is electrically connected to the low side switch, the low side P-type region being configured to operably receive the low side output signal; and a low side N-type region, which is coupled to the low side output terminal, the low side N-type region being configured to operably transmit the low side output signal, wherein beneath the top surface of the P-type semiconductor substrate, the low side N-type region encompasses a lateral side and a bottom side of the low side P-type region, to form a low side PN junction, wherein a low side substrate PN junction is formed between the low side N-type region and the P-type semiconductor substrate;

wherein the high side output terminal and the low side output terminal are configured to be coupled to an impedance circuit of the bus, the impedance circuit being coupled between the high side output terminal and the low side output terminal and being configured to operably generate a differential output signal according to the high side output signal and the low side output signal;

wherein the high side N-type region directly contacts the P-type semiconductor substrate and there is no insulating layer between the high side N-type region and the P-type semiconductor substrate;

wherein the low side N-type region directly contacts the P-type semiconductor substrate and there is no insulating layer between the low side N-type region and the P-type semiconductor substrate.

2. The output stage circuit of claim 1, wherein the high side diode structure includes:
a high side PNP bipolar junction transistor (BJT) having a base and a collector which are electrically connected to each other;
wherein the high side P-type region includes an emitter of the high side PNP BJT, whereas, the high side N-type region includes the base of the high side PNP BJT.

3. The output stage circuit of claim 2, wherein the high side PNP BJT has a concentric zone structure, wherein the emitter, the base and the collector of the high side PNP BJT are arranged from inside out successively, wherein the high side PNP BJT further includes an isolation region having N-type conductivity, the isolation region being electrically connected to and encompassing the collector of the high side PNP BJT, wherein the isolation region directly contacts the P-type semiconductor substrate, to form the high side PN junction.

4. The output stage circuit of claim 1, wherein the low side diode structure includes:
a low side PNP BJT having a base and a collector which are electrically connected to each other;
wherein the low side P-type region includes an emitter of the low side PNP BJT, whereas, the low side N-type region includes the base of the low side PNP BJT.

5. The output stage circuit of claim 4, wherein the low side PNP BJT has a concentric zone structure, wherein the emitter, the base and the collector of the low side PNP BJT are arranged from inside out successively, wherein the low side PNP BJT further includes an isolation region having N-type conductivity, the isolation region being electrically connected to and encompassing the collector of the low side PNP BJT, wherein the isolation region directly contacts the P-type semiconductor substrate, to form the low side PN junction.

6. The output stage circuit of claim 1, wherein the high side clamp circuit includes a P-type MOS field effect transistor (FET) having a source coupled to the high side N-type region, wherein a gate of the P-type MOSFET is biased to a predetermined control voltage, to prevent the voltage of the high side N-type region from being lower than the high side predetermined voltage, wherein a drain of the P-type MOSFET is electrically connected to the high side output terminal.

7. The output stage circuit of claim 6, wherein the high side clamp circuit further includes:
a Zener diode coupled between the gate and the source of the P-type MOSFET, the Zener diode being configured to operably ensure that the P-type MOSFET is turned ON;
a resistor connected in series to the Zener diode, the resistor being configured to operably limit a current flowing through the Zener diode; and
a capacitor coupled between the gate of the P-type MOSFET and a ground voltage level, the capacitor being configured to operably reduce a coupling effect caused by a gate-drain parasitic capacitor of the P-type MOSFET.

8. The output stage circuit of claim 1, wherein the high side clamp circuit includes a clamp PNP BJT having an emitter coupled to the high side N-type region, wherein a base of the clamp PNP BJT is biased to a predetermined control voltage, to prevent the voltage of the high side N-type region from being lower than the high side predetermined voltage, wherein a collector of the clamp PNP BJT is electrically connected to the high side output terminal.

9. An output stage circuit configured to operably transmit data via a bus, the output stage circuit being formed on an N-type semiconductor substrate, wherein the output stage circuit is configured to operably generate a differential output signal between a high side output terminal and a low side output terminal which are connected to the bus; the output stage circuit comprising:
a high side switch, which is configured to operate according to a high side operation signal, to generate a high side output signal, wherein the high side switch is electrically connected to an internal voltage;
a high side diode structure connected in series to the high side switch, the high side diode structure being configured to operably transmit the high side output signal and to block a reverse bias voltage, wherein the high side diode structure includes:
a high side P-type region, which is electrically connected to the high side switch, the high side P-type region being configured to operably receive the high side output signal; and
a high side N-type region, which is coupled to the high side output terminal, the high side N-type region being configured to operably transmit the high side output signal, wherein beneath a top surface of the N-type semiconductor substrate, the high side P-type region encompasses a lateral side and a bottom side of the high side N-type region, to form a high side PN junction, wherein a high side substrate PN junction is formed between the high side P-type region and the N-type semiconductor substrate;
a low side switch, which is configured to operate according to a low side operation signal, to generate a low side output signal, wherein the low side switch is electrically connected to a reference voltage;
a low side diode structure connected in series to the low side switch, the low side diode structure being configured to operably transmit the low side output signal and to block a reverse bias voltage, wherein the low side diode structure includes:

a low side N-type region, which is electrically connected to the low side switch, the low side N-type region being configured to operably receive the low side output signal; and a low side P-type region, which is coupled to the low side output terminal, the low side P-type region being configured to operably transmit the low side output signal, wherein beneath the top surface of the N-type semiconductor substrate, the low side P-type region encompasses a lateral side and a bottom side of the low side N-type region, to form a low side PN junction, wherein a low side substrate PN junction is formed between the low side P-type region and the N-type semiconductor substrate; and a low side clamp circuit, which is connected in series to the low side P-type region, the low side clamp circuit being configured to operably clamp a voltage of the high side N-type region, to ensure the voltage of the low side P-type region not to be higher than a low side predetermined voltage, thereby preventing a parasitic NPN bipolar junction transistor formed between the high side diode structure and the P-type semiconductor substrate from being turned ON;

wherein the high side output terminal and the low side output terminal are configured to be coupled to an impedance circuit of the bus, the impedance circuit being coupled between the high side output terminal and the low side output terminal and being configured to operably generate a differential output signal according to the high side output signal and the low side output signal;

wherein the high side P-type region directly contacts the N-type semiconductor substrate and there is no insulating layer between the high side P-type region and the N-type semiconductor substrate;

wherein the low side P-type region directly contacts the N-type semiconductor substrate and there is no insulating layer between the low side P-type region and the N-type semiconductor substrate.

10. The output stage circuit of claim 9, wherein the high side diode structure includes:

a high side NPN bipolar junction transistor (BJT) having a base and a collector which are electrically connected to each other;

wherein the high side P-type region includes the base of the high side NPN BJT, whereas, the high side N-type region includes an emitter of the high side NPN BJT.

11. The output stage circuit of claim 10, wherein the high side NPN BJT has a concentric zone structure, wherein the emitter, the base and the collector of the high side NPN BJT are arranged from inside out successively, wherein the high side NPN BJT further includes an isolation region having P-type conductivity, the isolation region being electrically connected to and encompassing the collector of the high side NPN BJT, wherein the isolation region directly contacts the N-type semiconductor substrate, to form the high side PN junction.

12. The output stage circuit of claim 9, wherein the low side diode structure includes:

a low side NPN BJT having a base and a collector which are electrically connected to each other;

wherein the low side P-type region includes the base of the low side NPN BJT, whereas, the low side N-type region includes an emitter of the low side NPN BJT.

13. The output stage circuit of claim 12, wherein the low side NPN BJT has a concentric zone structure, wherein the emitter, the base and the collector of the low side NPN BJT are arranged from inside out successively, wherein the low side NPN BJT further includes an isolation region having P-type conductivity, the isolation region being electrically connected to and encompassing the collector of the low side NPN BJT, wherein the isolation region directly contacts the N-type semiconductor substrate, to form the low side PN junction.

14. The output stage circuit of claim 9, wherein the low side clamp circuit includes an N-type MOSFET having a source coupled to the low side P-type region, wherein a gate of the N-type MOSFET is biased to a predetermined control voltage, to prevent the voltage of the low side P-type region from being higher than the low side predetermined voltage, wherein a drain of the N-type MOSFET is electrically connected to the low side output terminal.

15. The output stage circuit of claim 14, wherein the low side clamp circuit further includes:

a Zener diode coupled between the gate and the source of the N-type MOSFET, the Zener diode being configured to operably ensure that the N-type MOSFET is turned ON;

a resistor connected in series to a first voltage source, the resistor being configured to operably limit a current flowing through the Zener diode; and a capacitor coupled between the gate of the N-type MOSFET and a second voltage source, the capacitor being configured to operably reduce a coupling effect caused by a gate-drain parasitic capacitor of the N-type MOSFET;

wherein a voltage supplied from the second voltage source is higher than a voltage supplied from the first voltage source.

16. The output stage circuit of claim 9, wherein the low side clamp circuit includes a clamp NPN BJT having an emitter coupled to the low side P-type region, wherein a base of the clamp NPN BJT is biased to a predetermined control voltage, to prevent the voltage of the low side P-type region from being higher than the low side predetermined voltage, wherein a collector of the clamp NPN BJT is electrically connected to the low side output terminal.

* * * * *